(12) United States Patent
Lee et al.

(10) Patent No.: US 11,374,000 B2
(45) Date of Patent: Jun. 28, 2022

(54) TRENCH CAPACITOR WITH LATERAL PROTRUSION STRUCTURE

(71) Applicant: Taiwan Semiconductor Manufacturing Co., Ltd., Hsin-Chu (TW)

(72) Inventors: Ru-Liang Lee, Hsinchu (TW); Ming Chyi Liu, Hsinchu (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 91 days.

(21) Appl. No.: 16/814,142

(22) Filed: Mar. 10, 2020

(65) Prior Publication Data
US 2021/0288047 A1    Sep. 16, 2021

(51) Int. Cl.
*H01L 27/08*  (2006.01)
*H01L 27/108*  (2006.01)
*H01L 49/02*  (2006.01)

(52) U.S. Cl.
CPC .... *H01L 27/0805* (2013.01); *H01L 27/10817* (2013.01); *H01L 28/40* (2013.01)

(58) Field of Classification Search
CPC ............... H01L 27/0805; H01L 28/40; H01L 28/86–92; H01L 27/10808; H01L 27/10817

See application file for complete search history.

(56) References Cited

U.S. PATENT DOCUMENTS 5,976,945 A    11/1999  Chi et al.
6,027,968 A     2/2000  Nguyen et al.
(Continued)

FOREIGN PATENT DOCUMENTS

| JP | 2010238826 A | 10/2010 |
| KR | 20150052820 A | 5/2015 |
| TW |    381340 B | 2/2000 |

OTHER PUBLICATIONS

Mellor, Chris."Extensive 3D NAND Drives Very Expensive to Make." The Register, published on Apr. 9, 2015.
(Continued)

*Primary Examiner* — Nelson Garces
(74) *Attorney, Agent, or Firm* — Eschweiler & Potashnik, LLC

(57) ABSTRACT

Various embodiments of the present application are directed towards a semiconductor device comprising a trench capacitor, the trench capacitor comprising a plurality of lateral protrusions. In some embodiments, the trench capacitor comprises a dielectric structure over a substrate. The dielectric structure may comprise a plurality of dielectric layers overlying the substrate. The dielectric structure may comprise a plurality of lateral recesses. In some embodiments, the plurality of lateral protrusions extend toward and fill the plurality of lateral recesses. By forming the trench capacitor with the plurality of lateral protrusions filling the plurality of lateral recesses, the surface area of the capacitor is increased without increasing the depth of the trench. As a result, greater capacitance values may be achieved without necessarily increasing the depth of the trench and thus, without necessarily increasing the size of the semiconductor device.

20 Claims, 21 Drawing Sheets

(56) References Cited

U.S. PATENT DOCUMENTS

| | | | |
|---|---|---|---|
| 6,204,141 B1 | 3/2001 | Lou | |
| 6,624,018 B1* | 9/2003 | Yu | H01L 28/87 |
| | | | 257/E21.016 |
| 6,982,403 B2 | 1/2006 | Yang et al. | |
| 2007/0224757 A1 | 9/2007 | Cheng et al. | |
| 2008/0145997 A1 | 6/2008 | Tu | |
| 2017/0110402 A1 | 4/2017 | Smith et al. | |
| 2017/0186837 A1 | 6/2017 | Yen et al. | |
| 2018/0040626 A1 | 2/2018 | Zhu et al. | |
| 2018/0323200 A1* | 11/2018 | Tang | H01L 27/10805 |
| 2020/0066922 A1 | 2/2020 | Cheng et al. | |

OTHER PUBLICATIONS

EE World. "Vertical Transistor NAND Flash Chip Technology May be Used in Advance." Published on Aug. 3, 2011.
U.S. Appl. No. 17/361,723, filed Jun. 29, 2021.

* cited by examiner

US 11,374,000 B2

TRENCH CAPACITOR WITH LATERAL PROTRUSION STRUCTURE

BACKGROUND

Mobile phones and other mobile devices often rely upon ceramic capacitors and other passive devices. These capacitors are discretely mounted to printed circuit boards (PCBs) of the mobile devices and are electrically coupled to integrated circuits (ICs) of the mobile devices by the PCBs. However, this approach uses large amounts of surface area on the PCBs and hence limits mobile device size and/or mobile device functionality. Further, discretely mounting and electrically coupling the passive devices increases manufacturing costs. Accordingly, mobile devices are increasingly turning to integrated passive devices (IPDs) to reduce size, reduce cost, and increase functionality. An IPD is a collection of one or more passive devices embedded into a single monolithic device and packaged as an integrated circuit (IC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
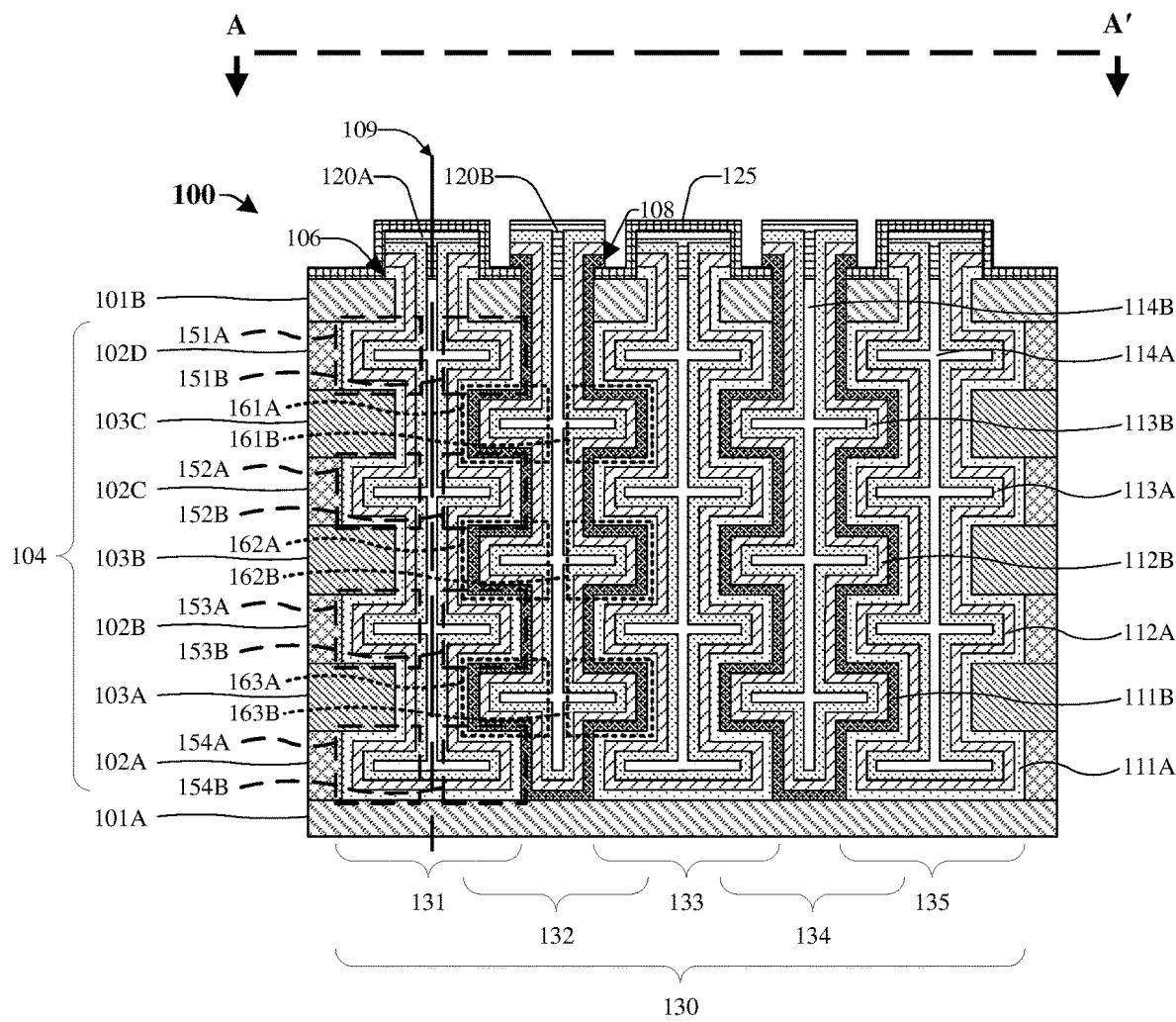
FIGS. 1A and 1B illustrate cross-sectional views of some embodiments of a semiconductor device comprising a trench capacitor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Trench capacitors are commonly embedded in integrated passive devices (IPDs) and used in place of ceramic capacitors to reduce the size of mobile devices, reduce the cost of mobile devices, increase the functionality of mobile devices, or any combination of the foregoing. In some instances, a semiconductor device may comprise a trench capacitor. The trench capacitor may overlie a substrate and fill a trench defined by the substrate. The trench may comprise solely vertical sidewalls. A first conductor may fill the trench and line walls of the trench. An insulator may overlie the first conductor and line walls of the first conductor. A second conductor may overlie the insulator and line walls of the insulator.

A challenge with conventional trench capacitors is that because the trench comprises solely vertical sidewalls the surface areas of the conductive layers are limited by a depth of the trench, and therefore a capacitance of the trench capacitor is also limited by the depth of the trench. As a result, achieving greater capacitance values requires increasing the depth of the trench and may also increase a cost of manufacturing the trench capacitors.

Various embodiments of the present application are directed towards a semiconductor device comprising a trench capacitor, the trench capacitor comprising a plurality of lateral protrusions. In some embodiments, the trench capacitor comprises a dielectric structure over a substrate. The dielectric structure may comprise a plurality of dielectric layers overlying the substrate. The dielectric structure may comprise a plurality of lateral recesses. In some embodiments, the plurality of lateral protrusions extend toward and fill the plurality of lateral recesses. By forming the trench capacitor with the plurality of lateral protrusions filling the plurality of lateral recesses, the surface area of the capacitor is increased without increasing the depth of the trench. As a result, greater capacitance values may be achieved without necessarily increasing the depth of the trench and thus, without necessarily increasing the size of the semiconductor device.

Referring to FIG. 1A, a cross-sectional view of some embodiments of a semiconductor device 100 comprising a trench capacitor 130 is provided. The semiconductor device 100 may be or comprise an integrated circuit (IC), an IPD, or some other semiconductor device. The semiconductor device 100 comprises a substrate 101A and a dielectric structure 104 over the substrate. The substrate 101A may be or comprise silicon, germanium, any III-V compound, or any other suitable semiconductor material. The substrate 101A may have a thickness of 50 angstroms or more.

The dielectric structure 104 includes a plurality of dielectric layers 102A-D/103A-C. The plurality of dielectric layers 102A-D/103A-C include a first set of dielectric layers 102A-D and a second set of dielectric layers 103A-C. The first set of dielectric layers 102A-D and the second set of dielectric layers 103A-C may be disposed one over the other in an alternating fashion. The first set of dielectric layers 102A-D and the second set of dielectric layers 103A-C may comprise silicon oxide, silicon nitride, silicon carbide, silicon oxynitride, or any other suitable dielectric material. The first set of dielectric layers 102A-D may comprise a first dielectric material, and the second set of dielectric layers 103A-C may comprise a second dielectric material that differs from the first dielectric material. Typically, for example, the first and second dielectric materials have different etch rates for a predetermined etch. Each layer of the first set of dielectric layers 102A-D and the second set of dielectric layers 103A-C may have a thickness of 50 angstroms to 10 micrometers. The plurality of dielectric layers 102A-D/103A-C may further comprise a plurality of lateral recesses.

In some embodiments, the trench capacitor 130 includes a first capacitor structure 131 and a second capacitor structure 132 that is laterally adjacent to the first capacitor structure 131. The first capacitor structure 131 includes a first conductive trunk 106 that extends along a first axis 109. The first capacitor structure 131 further includes a first set of lateral protrusions 151A-154A that extend toward and fill the plurality of lateral recesses. The first capacitor structure 131 may further comprise a second set of lateral protrusions 151B-154B that extend toward the second capacitor structure 132. The first set of lateral protrusions 151A-154A and the second set of lateral protrusions 151B-154B may be referred to as a plurality of first conductive branches that extend outwardly from the first conductive trunk 106 and extend perpendicular to the first axis 109. The second capacitor structure 132 includes a second conductive trunk 108 that extends in parallel with the first axis 109. The second capacitor structure further includes a third set of lateral protrusions 161A-163A that extend toward the first capacitor structure 131. The third set of lateral protrusions 161A-163A are interdigitated with the second set of lateral protrusions 151B-154B. The second capacitor structure 132 may further comprise a fourth set of lateral protrusions 161B-163B that extend toward a third capacitor structure 133 that is laterally adjacent to the second capacitor structure 132. The fourth set of lateral protrusions 161B-163B may be interdigitated with lateral protrusions (not labeled) of the third capacitor structure 133. The third set of lateral protrusions and the fourth set of lateral protrusions may be referred to as a plurality of second conductive branches that extend outwardly from the second conductive trunk 108 and extend perpendicular to the first axis 109. In some embodiments, the trench capacitor 130 may further comprise a fourth capacitor structure 134 that is laterally adjacent to the third capacitor structure 133, and a fifth capacitor structure 135 that is laterally adjacent to the fourth capacitor structure 134, each comprising lateral protrusions (not labeled). The third capacitor structure 133, the fourth capacitor structure 134, and the fifth capacitor structure 135 each comprise a conductive trunk (not labeled) that extends in parallel with the first axis 109. In addition, each of the lateral protrusions (not labeled) of the third capacitor structure 133, fourth capacitor structure 134, and fifth capacitor structure 135 may be referred to as conductive branches (not labeled) that extend outwardly from their respective conductive trunks (not labeled) and extend perpendicular to the first axis 109. In some embodiments, the trench capacitor 130 may comprise a different number of capacitor structures.

In some embodiments, the first capacitor structure 131, the third capacitor structure 133, and the fifth capacitor structure 135 include a first outer electrode layer 111A overlying the substrate and lining the plurality of lateral recesses, a first insulator layer 112A overlying and lining the first outer electrode layer 111A, a first inner electrode layer 113A overlying and lining the first insulator layer 112A, and a first set of cavities 114A, such as air gaps, disposed within the first inner electrode layer 113A. The first outer electrode layer 111A and the first inner electrode layer 113A may be or comprise titanium, titanium nitride, tantalum, tantalum nitride, any other metal, or any other suitable material. The first insulator layer 112A may comprise silicon oxide, silicon nitride, hafnium oxide, aluminum oxide, zirconium oxide, some other dielectric, or any combination of the foregoing. The first set of cavities 114A may comprise air, an inert or noble gas, vacuum, or some other gas. The first outer electrode layer 111A and the first inner electrode layer 113A may have a thickness of 50 to 500 angstroms. The first insulator layer 112A may have a thickness of 10 to 200 angstroms. In some embodiments, the first capacitor structure 131, the third capacitor structure 133, and the fifth capacitor structure 135 may comprise a different number of electrode layers and insulator layers.

In some embodiments, the second capacitor structure 132 and the fourth capacitor structure 134 include a second outer electrode layer 111B overlying the substrate, a second insulator layer 112B overlying and lining the second outer electrode layer 111B, a second inner electrode layer 113B overlying and lining the second insulator layer 112B, and a second set of cavities 114B disposed within the second inner electrode layer 113B. The second outer electrode layer 111B and the second inner electrode layer 113B may be or comprise titanium, titanium nitride, tantalum, tantalum nitride, any other metal, or any other suitable material. The second insulator layer 112B may comprise silicon oxide, silicon nitride, hafnium oxide, aluminum oxide, zirconium oxide, some other dielectric, or any combination of the foregoing. The second set of cavities 114B may comprise air, an inert or noble gas, vacuum, or some other gas. The second outer electrode layer 111B and the second inner electrode layer 113B may have a thickness of 50 to 500 angstroms. The second insulator layer 112B layer may have a thickness of 10 to 200 angstroms. In some embodiments, the second capacitor structure 132 and the fourth capacitor structure 134 may comprise a different number of electrode layers and insulator layers.

In some embodiments, the first outer electrode layer 111A contacts the second outer electrode layer 111B at one or more locations, such that the first outer electrode layer 111A and the second outer electrode layer 111B together establish a single outer electrode of the trench capacitor 130. For example, the first outer electrode layer 111A may contact the second outer electrode layer 111B along any of an interface between the first capacitor structure 131 and the second capacitor structure 132, an interface between the second capacitor structure 132 and the third capacitor structure 133, an interface between the third capacitor structure 133 and the fourth capacitor structure 134, and an interface between the fourth capacitor structure 134 and the fifth capacitor structure 135.

Further, in some embodiments, the first inner electrode layer 113A is electrically coupled to the second inner electrode layer 113B, for example, through an ohmic contact or interconnect structure (not illustrated in FIG. 1A), such that the first inner electrode layer 113A and the second inner electrode layer 113B together establish a single inner electrode of the trench capacitor 130. The first insulator layer 112A and the second insulator layer 112B isolate the outer electrode (e.g., 111A, 111B) from the inner electrode (113A, 113B) from one another, such that an overall capacitance of the trench capacitor 130 is defined between the outer electrode and the inner electrode.

In some embodiments, the semiconductor device 100 comprises a support layer 101B over the plurality of dielectric layers 102A-D/103A-C. The support layer 101B may be or comprise polysilicon. The support layer 101B may comprise the same or different materials as the substrate 101A. The support layer 101B may have a thickness of 50 to 1000 angstroms.

In some embodiments, the semiconductor device 100 comprises a capping layer 120A/120B over the first set of cavities 114A and the second set of cavities 114B. The capping layer 120A/120B may comprise silicon oxide, silicon nitride, or any other dielectric material. The capping layer 120A/120B may have a thickness of 50 to 1000 angstroms.

In some embodiments, the semiconductor device 100 comprises an isolation layer 125 overlying the capping layer 120A. The isolation layer 125 may be a passivation layer. The isolation layer 125 may comprise silicon oxide, silicon nitride, or any other dielectric material. The isolation layer 125 may have a thickness of 50 to 1000 angstroms.

As discussed above, the lateral protrusions of the trench capacitor 130 allow for an increased surface area of the trench capacitor 130 without increasing the depth of the trench capacitor 130. As a result, greater capacitance values may be achieved without necessarily increasing the cost of manufacturing the semiconductor device 100.

Figure 1B:
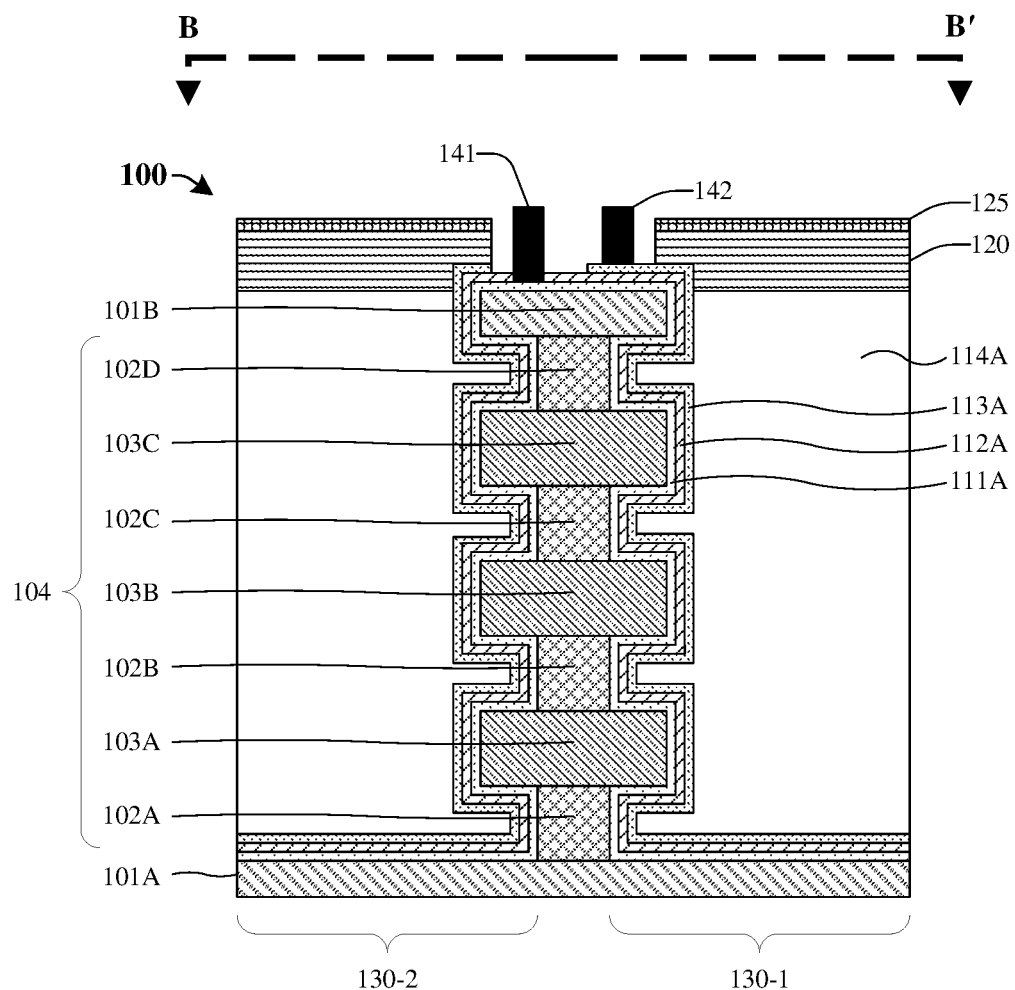

Referring to FIG. 1B, another cross-sectional view of some embodiments of the semiconductor device 100 of FIG. 1A is provided. The semiconductor device 100 comprises a first trench capacitor 130-1 and a second trench capacitor 130-2. In some embodiments, the first trench capacitor is the trench capacitor 130 of FIG. 1A. The semiconductor device 100 further comprises first contacts 141 and second contacts 142 over the dielectric structure 104. The first contacts 141 extend through the first inner electrode layer 113A and the first insulator layer 112A and are coupled to the first outer electrode layer 111A. The second contacts 142 are coupled to the first inner electrode layer 113A. The first contacts 141 are laterally separated from the second contacts 142.

Figure 2:
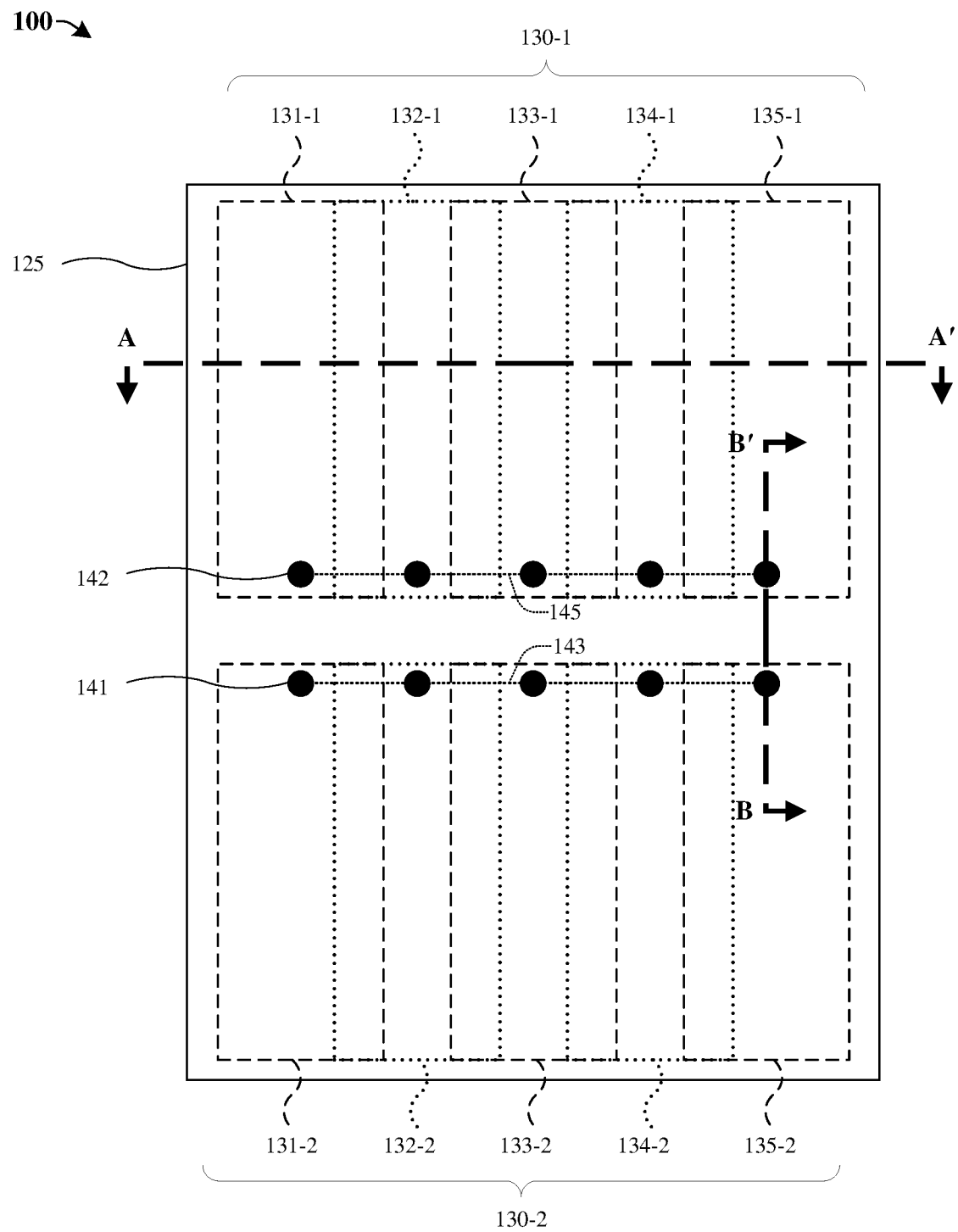
FIG. 2 illustrates a top view of some embodiments of the semiconductor device of FIGS. 1A and 1B.

Referring to FIG. 2, a top view of some embodiments of the semiconductor device of FIGS. 1A and 1B is provided. The cross-section view illustrated in FIG. 1A may, for example, be taken along line A-A'. The cross-sectional view illustrated in FIG. 1B may, for example, be taken along line B-B'.

In some embodiments, each of the first contacts 141 are electrically tied together (see e.g., line 143) and each of the second contacts 142 are electrically tied together (see e.g., line 145). In some embodiments, the first trench capacitor 130-1 and the second trench capacitor 130-2 have rectangular shaped top views. In other embodiments, the first trench capacitor 130-1 and the second trench capacitor 130-2 may comprise other shaped top views. For example, oval shaped, square shaped, circular shaped, or some other suitable shape.

Figure 3A:
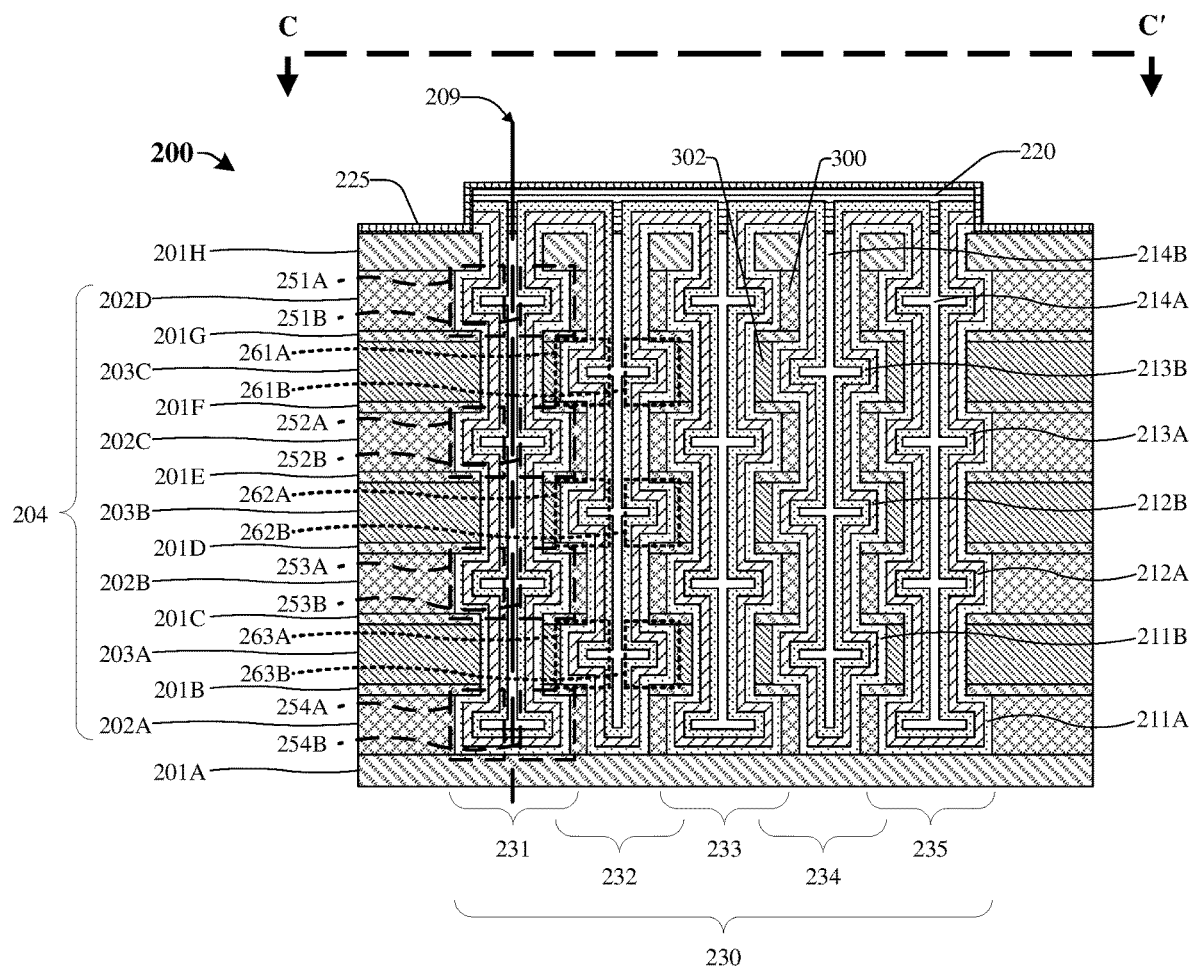
FIGS. 3A and 3B illustrate cross-sectional views of some alternative embodiments of a semiconductor device comprising a trench capacitor.

Referring to FIG. 3A, a cross-sectional view of some embodiments of a semiconductor device 200 comprising a trench capacitor 230 is provided. In general, the trench capacitor 230 of FIG. 3A has analogous features and layers as were previously discussed with respect to the trench capacitor 130 of FIG. 1A. Except, however, the trench capacitor 230 has additional dielectric material (e.g., 300, 302) separating sidewalls of neighboring conductive trunks of the capacitor structures from one another. For example, in contrast, neighboring conductive trunks of the capacitor structures in FIG. 1A had sidewalls that directly contacted one another. As will be appreciated in more detail below, the trench capacitor 230 also includes additional support layers 201B-201G that were not illustrated in FIG. 1A, though it will be appreciated such features could also be included in some embodiments consistent with FIG. 1A.

More particularly, the semiconductor device 200 may be or comprise an integrated circuit (IC), an IPD, or some other semiconductor device. The semiconductor device 200 comprises a substrate 201A and a dielectric structure 204 over the substrate. The substrate 201A may be or comprise silicon, germanium, any III-V compound, or any other suitable semiconductor material. The substrate 201A may have a thickness of 50 angstroms or more.

The dielectric structure 204 includes a plurality of dielectric layers 202A-D/103A-C and a plurality of support layers 201B-201G. The plurality of dielectric layers 202A-D/203A-C includes a first set of dielectric layers 202A-D and a second set of dielectric layers 203A-C. The first set of dielectric layers 202A-D and the second set of dielectric layers 203A-C may be disposed one over the other in an alternating fashion. The first set of dielectric layers 202A-D and the second set of dielectric layers 203A-C may comprise silicon oxide, silicon nitride, silicon carbide, silicon oxynitride, or any other suitable dielectric material. The first set of dielectric layers 202A-D may comprise different materials than the second set of dielectric layers 203A-C. Each layer of the first set of dielectric layers 202A-D and the second set of dielectric layers 203A-C may have a thickness of 50 angstroms to 20 micrometers. The plurality of dielectric layers 202A-D/203A-C may further comprise a plurality of lateral recesses.

The plurality of support layers 201B-201G may comprise polysilicon. The plurality of support layers may comprise the same material(s) as the substrate 201A. The plurality of support layers 201B-201G may be layered in between each layer of the plurality of dielectric layers 202A-D/203A-C such that each support layer of the plurality of support layers 201B-201G is vertically disposed between a layer of the first set of dielectric layers 202A-D and a layer of the second set of dielectric layers 203A-C. For example, a first support layer 201B may be vertically disposed between a first dielectric layer 202A of the first set of dielectric layers 202A-D and a second dielectric layer 203A of the second set of dielectric layers 203A-C.

In some embodiments, the trench capacitor 230 includes a first capacitor structure 231 and a second capacitor structure 232 that is laterally adjacent to the first capacitor structure 231. The first capacitor structure 231 includes a first conductive trunk and a first set of lateral protrusions (or branches) 251A-254A that extend toward and fill the plurality of lateral recesses. The first capacitor structure 231 may further comprise a second set of lateral protrusions 251B-254B that extend toward the second capacitor structure 232. In some embodiments, the second capacitor structure 232 comprises a second conductive trunk and a third set of lateral protrusions (or branches) 261A-263A that extend toward the first capacitor structure 231. The third set of lateral protrusions 261A-263A may be interdigitated with the second set of lateral protrusions 251B-254B. The second capacitor structure 232 may further comprise a fourth set of lateral protrusions 261B-263B that extend toward a third capacitor structure 233 that is laterally adjacent to the second capacitor structure 232. The fourth set of lateral protrusions 261B-263B may be interdigitated with lateral protrusions (not labeled) of the third capacitor structure 233. In some embodiments, the trench capacitor 230 may further comprise a fourth capacitor structure 234 that is laterally adjacent to the third capacitor structure 233, and a fifth capacitor structure 235 that is laterally adjacent to the fourth capacitor structure 234, each comprising lateral protrusions (not labeled). In some embodiments, the trench capacitor 230 may comprise a different number of capacitor structures.

In some embodiments, the first capacitor structure 231, the third capacitor structure 233, and the fifth capacitor structure 235 include a first outer electrode layer 211A overlying the substrate and lining the plurality of lateral recesses, a first insulator layer 212A overlying and lining the first outer electrode layer 211A, a first inner electrode layer 213A overlying and lining the first insulator layer 212A, and a first set of cavities 214A are disposed within the first inner electrode layer 213A. The first outer electrode layer 211A and the first inner electrode layer 213A may be or comprise titanium, titanium nitride, tantalum, tantalum nitride, any other metal, or any other suitable material. The first insulator layer 212A may comprise silicon oxide, silicon nitride, hafnium oxide, aluminum oxide, zirconium oxide, some other dielectric, or any combination of the foregoing. The first set of cavities 214A may comprise air, an inert or noble gas, vacuum, or some other gas. The first outer electrode layer 211A and the first inner electrode layer 213A may have a thickness of 50 to 500 angstroms. The first insulator layer 212A may have a thickness of 10 to 200 angstroms. In some embodiments, the first capacitor structure 231, the third capacitor structure 233, and the fifth capacitor structure 235 may comprise a different number of electrode layers and insulator layers.

In some embodiments, the second capacitor structure 232 and the fourth capacitor structure 234 include a second outer electrode layer 211B overlying the substrate, a second insulator layer 212B overlying and lining the second outer electrode layer 211B, a second inner electrode layer 213B overlying and lining the second insulator layer 212B, and a second set of cavities 214B disposed within the second inner electrode layer 213B. The second outer electrode layer 211B and the second inner electrode layer 213B may be or comprise titanium, titanium nitride, tantalum, tantalum nitride, any other metal, or any other suitable material. The second outer electrode layer 211B comprises the same material as the first outer electrode layer 211A. The second insulator layer 212B may comprise silicon oxide, silicon nitride, hafnium oxide, aluminum oxide, zirconium oxide, some other dielectric, or any combination of the foregoing. The second set of cavities 214B may comprise air, an inert or noble gas, vacuum, or some other gas. The second outer electrode layer 211B and the second inner electrode layer 213B may have a thickness of 50 to 500 angstroms. The second insulator layer 212B layer may have a thickness of 10 to 200 angstroms. In some embodiments, the second capacitor structure 132 and the fourth capacitor structure 134 may comprise a different number of electrode layers and insulator layers.

In some embodiments, the first outer electrode layer 211A is laterally separated from the second outer electrode layer 211B by the plurality of dielectric layers 202A-D/203A-C at one or more locations. In some embodiments, the first outer electrode layer 211A is vertically separated from the second outer electrode layer 211B by the plurality of support layers 201B-201G at one or more locations. For example, the first outer electrode layer 211A may be separated from the second outer electrode layer 211B by the dielectric structure 204 along any of an interface between the first capacitor structure 231 and the second capacitor structure 232, an interface between the second capacitor structure 232 and the third capacitor structure 233, an interface between the third capacitor structure 233 and the fourth capacitor structure 234, and an interface between the fourth capacitor structure 234 and the fifth capacitor structure 235.

In some embodiments, the semiconductor device 200 comprises a top support layer 201H over the plurality of dielectric layers 202A-D/203A-C. The top support layer 201H may be or comprise polysilicon. The top support layer 201H may comprise the same or different materials as the substrate 201A. The top support layer 201H may have a thickness of 50 to 1000 angstroms.

In some embodiments, the semiconductor device 200 comprises a capping layer 220 over the first set of cavities 214A and second set of cavities 214B. The capping layer 220 may comprise silicon oxide, silicon nitride, or any other dielectric material. The capping layer 220 may have a thickness of 50 to 1000 angstroms.

In some embodiments, the semiconductor device 200 comprises an isolation layer 225 overlying the capping layer 220. The isolation layer 225 may be a passivation layer. The isolation layer 225 may comprise silicon oxide, silicon nitride, or any other dielectric material. The isolation layer 225 may have a thickness of 50 to 1000 angstroms.

As discussed above, the lateral protrusions of the trench capacitor 230 allow for an increased surface area of the trench capacitor 230 without increasing the depth of the trench capacitor 230. As a result, greater capacitance values may be achieved without necessarily increasing the cost of manufacturing the semiconductor device 200.

Figure 3B:
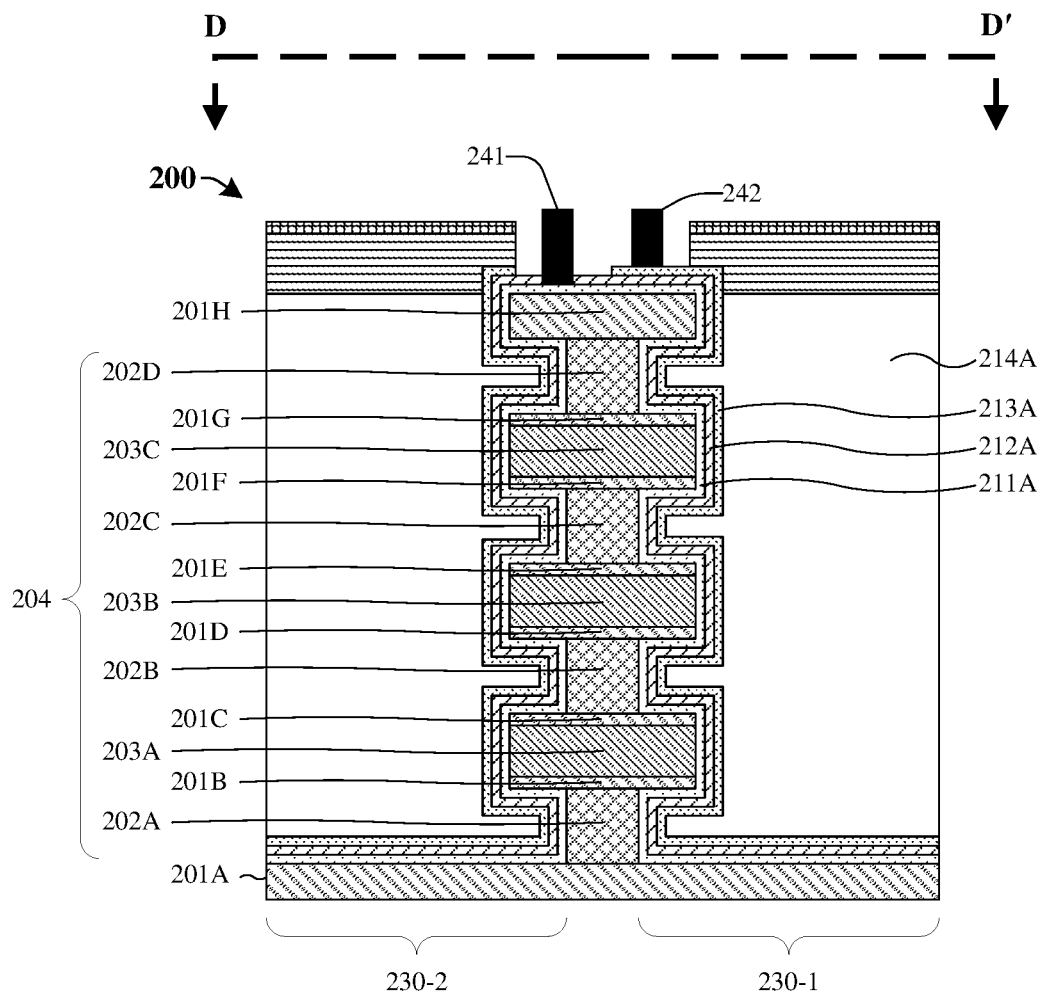

Referring to FIG. 3B, another cross-sectional view of some embodiments of the semiconductor device 200 of FIG. 3A is provided. The semiconductor device 200 comprises a first trench capacitor 130-1 and a second trench capacitor 130-2. In some embodiments, the first trench capacitor is the trench capacitor 230 of FIG. 3A. The semiconductor device 200 further comprises first contacts 241 and second contacts 242 over the dielectric structure 204. The first contacts 241 extend through the first inner electrode layer 213A and the first insulator layer 212A and are coupled to the first outer electrode layer 211A. The second contacts 242 are coupled to the first inner electrode layer 213A. The first contacts 241 are laterally separated from the second contacts 242.

Figure 4:
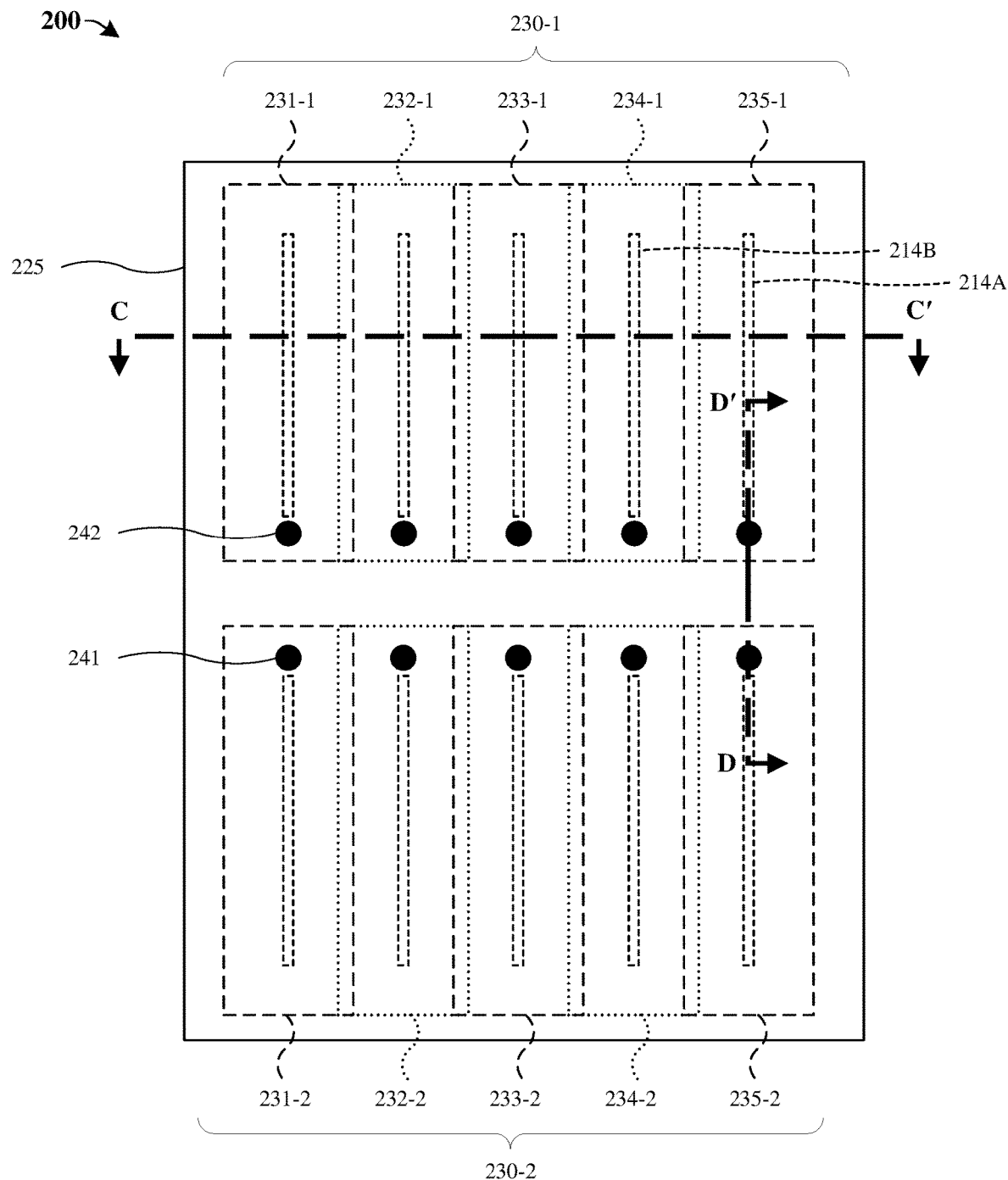
FIG. 4 illustrates a top view of some embodiments of the semiconductor device of FIGS. 3A and 3B.

Referring to FIG. 4, a top view of some embodiments of the semiconductor device of FIGS. 3A and 3B is provided. The cross-section view illustrated in FIG. 3A may, for example, be taken along line C-C'. The cross-sectional view illustrated in FIG. 3B may, for example, be taken along line D-D'.

In some embodiments, each of the first contacts 241 are electrically tied together and each of the second contacts 242 are electrically tied together. In some embodiments, the first trench capacitor 230-1 and the second trench capacitor 230-2 have rectangular shaped top views. In other embodiments, the first trench capacitor 230-1 and the second trench capacitor 130-2 may comprise other shaped top views. For example, oval shaped, square shaped, circular shaped, or some other suitable shape.

Referring to FIGS. 5A-5J, a series of cross-sectional views of some embodiments of a method for forming the semiconductor device 100 of FIGS. 1A, 1B, and 2 is provided. The semiconductor device 100 may be or comprise an IC, an IPD, or some other semiconductor device.

Figure 5A:
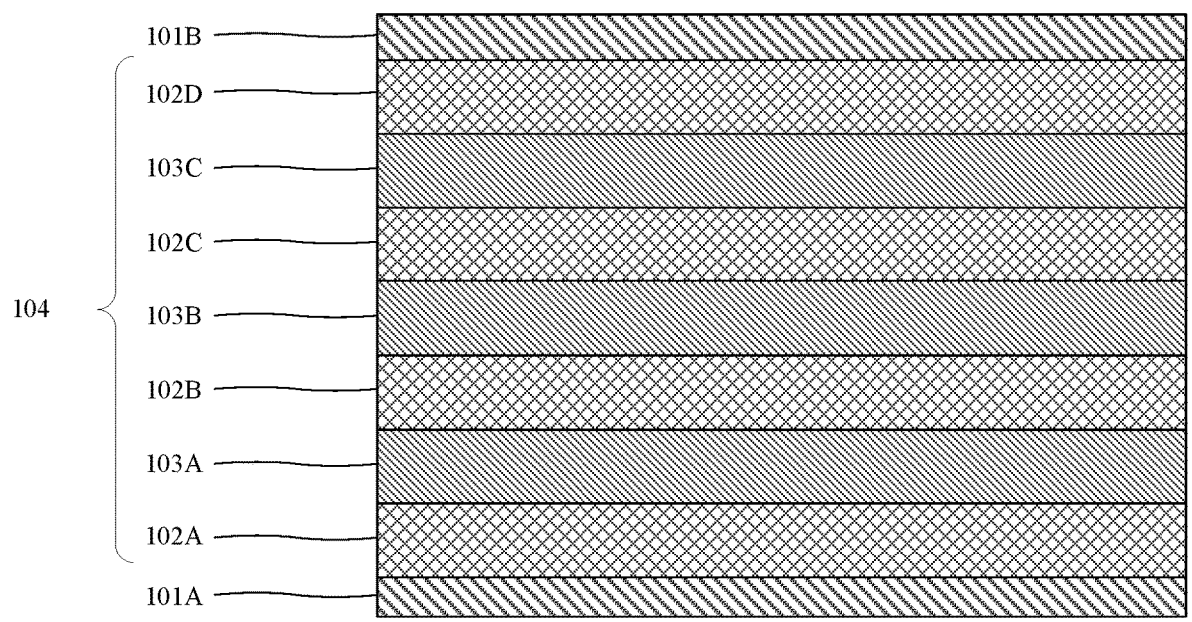
FIGS. 5A-5J illustrate a series of cross-sectional views of some embodiments of a method for forming the semiconductor device of FIGS. 1A, 1B, and 2.

Referring to FIG. 5A, a dielectric structure 104 is formed over a substrate 101A. The dielectric structure 104 includes a plurality of dielectric layers 102A-D/103A-C. The substrate 101A may be or comprise silicon, germanium, any III-V compound, or any other suitable semiconductor material. The substrate 101A may have a thickness of 50 angstroms or more. The plurality of dielectric layers 102A-D/103A-C includes a first set of dielectric layers 102A-D and a second set of dielectric layers 103A-C. The first set of dielectric layers 102A-D and the second set of dielectric layers 103A-C may be formed one over the other in an alternating fashion. For example, a first dielectric layer 102A of the first set of dielectric layers 102A-D is formed over the substrate 101A, a second dielectric layer 103A of the second set of dielectric layers 103A-C is formed over the first dielectric layer 102A, a third dielectric layer 102B of the first set of dielectric layers 102A-D is formed over the second dielectric layer 103A, and so on. The first set of dielectric layers 102A-D and the second set of dielectric layers 103A-C may comprise silicon oxide, silicon nitride, silicon carbide, silicon oxynitride, or any other suitable dielectric material. The first set of dielectric layers 102A-D may comprise different materials than the second set of dielectric layers 103A-C. The first set of dielectric layers 102A-D include a first dielectric material that has a first etch rate for a predetermined etch, and the second set of dielectric layers 103A-C include a second dielectric material that has a second etch rate, which differs from the first etch rate, for the predetermined etch. For example, the first etch rate may be higher than the second etch rate for the predetermined etch. Each layer of the first set of dielectric layers 102A-D and the second set of dielectric layers 103A-C may have a thickness of 50 angstroms to 10 micrometers. A support layer 101B is formed over the dielectric structure 104. The support layer 101B may be or comprise polysilicon. The support layer 101B may comprise the same or different materials as the substrate 101A. The support layer 101B may have a thickness of 50 to 1000 angstroms.

Figure 5B:
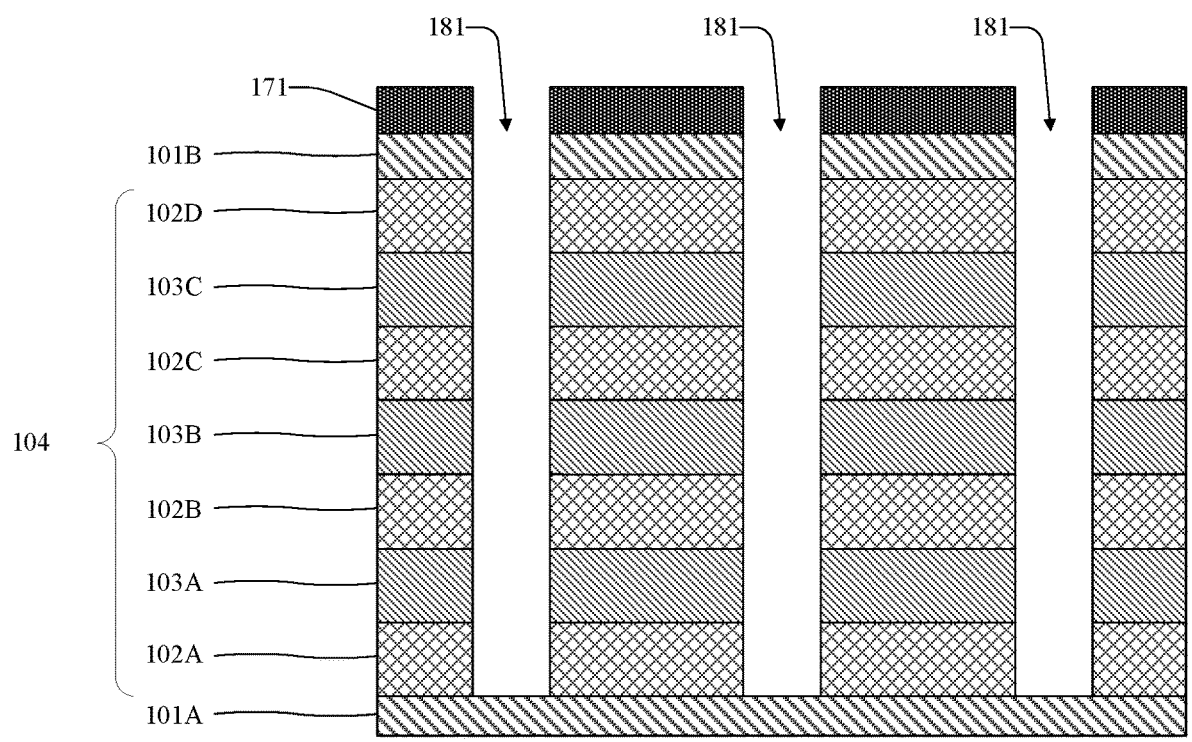

Referring to FIG. 5B, a first mask 171 is formed over the support layer 101B, the dielectric structure 104, and the substrate 101A. The support layer 101B and the dielectric structure 104 are then patterned with the first mask 171 in place to form a first set of trenches 181. The first mask 171 may comprise, for example, photoresist, silicon oxide, silicon nitride, some other mask material, or any combination of the foregoing. The patterning may comprise a dry etch. In some embodiments, the dry etch may utilize $CF_4$ plasma, $CHF_3$ plasma, $C_4F_8$ plasma, $SF_6$ plasma, $NF_3$ plasma, or some other plasma to pattern the dielectric structure 104. In some embodiments, the dry etch may utilize $Cl_2$ plasma, HBr plasma, Ar plasma, or some other plasma to pattern the support layer 101B.

Figure 5C:
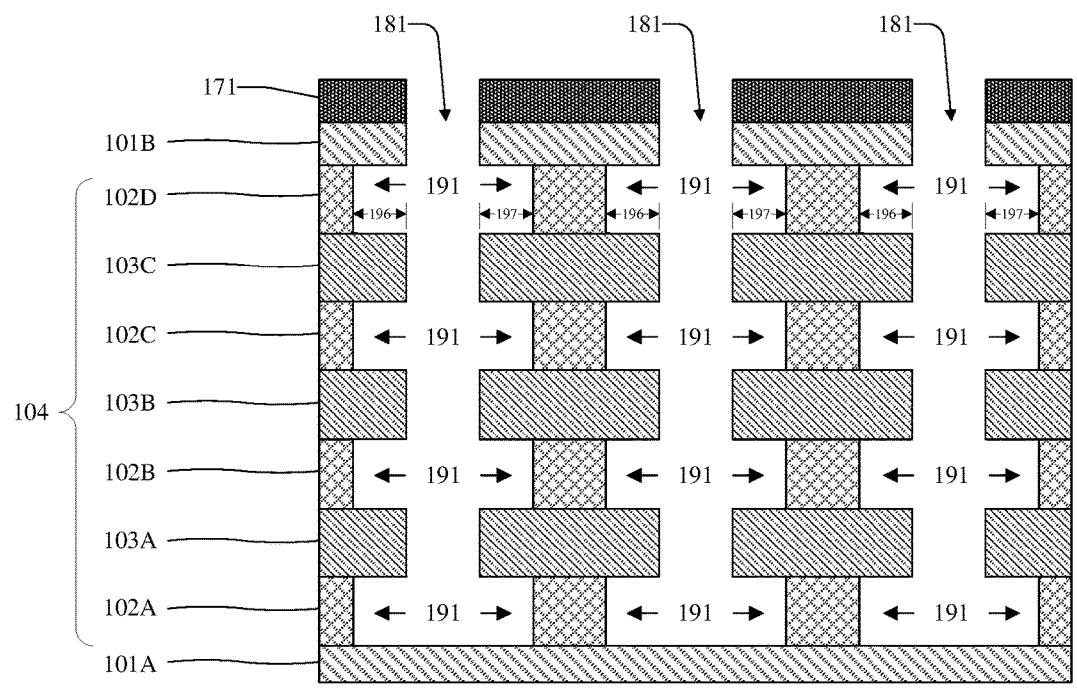

Referring to FIG. 5C, the predetermined etch is then applied, such that the dielectric structure 104 is patterned with the first mask 171 in place to form a first set of lateral recesses 191 that extend outward from the first set of trenches 181. The predetermined etch may comprise a wet etch wherein a liquid of the wet etch fills the first set of trenches 181. Because the etch rate of the first dielectric material (e.g., 102A-D) is higher than that of the second dielectric material (e.g., 103A-C) for the predetermined etch, the wet etch may be performed with high selectivity to the first set of dielectric layers 102A-D relative to the second set of dielectric layers 103A-C such that the etchant etches the first set of dielectric layers 102A-D faster than the second set of dielectric layers 103A-C to form the first set of lateral recesses 191. The wet etch may utilize HF, $H_3PO_4$, TMAH, $NH_4OH$, KOH, NaOH, some other etchant, or any combination of the foregoing to selectively etch the dielectric structure 104 to form the first set of lateral recesses 191. The predetermined etch may be performed for a predetermined time to control a lateral distance in which the first set of lateral recesses 191 extend. In some embodiments, lateral recesses of the first set of lateral recesses 191 may be symmetric about their respective trenches of the first set of trenches 181 such that a first distance 196 at which the first set of lateral recesses 191 extend from the first set of trenches 181 is equal to a second distance 197 at which the first set of lateral recesses 191 extend from the first set of trenches 181. In some embodiments, the patterning comprises removing the first mask 171 after the predetermined etch is applied. Although FIG. 5C shows an example where the first mask 171 is left in place while the predetermined etch is applied, in some alternative embodiments, the first mask 171 may be removed before the predetermined etch is applied.

In some embodiments, etch rates of the substrate 101A and the support layer 101B may be lower than that of the first dielectric material (e.g., 102A-D) such that the wet etchant may also etch the first set of dielectric layers 102A-D faster than the substrate 101A and the support layer 101B. As a result, the predetermined etch may not extend the first set of trenches 181 vertically into the substrate 101A or laterally into the support layer 101B.

In some embodiments, sidewalls of the first set of dielectric layers 102A-D may be planar after the predetermined etch is applied, as illustrated in FIG. 5C. In addition, sidewalls, upper surfaces, and lower surfaces of the second set of dielectric layers 103A-C may be planar after the predetermined etch is applied, such that the first set of lateral recesses 191 have square corners or sharp corners as illustrated in FIG. 5C. However, it will be appreciated that the aforementioned sidewalls, corners, and/or surfaces may alternatively be curved or rounded as a result of the predetermined etch.

Figure 5D:
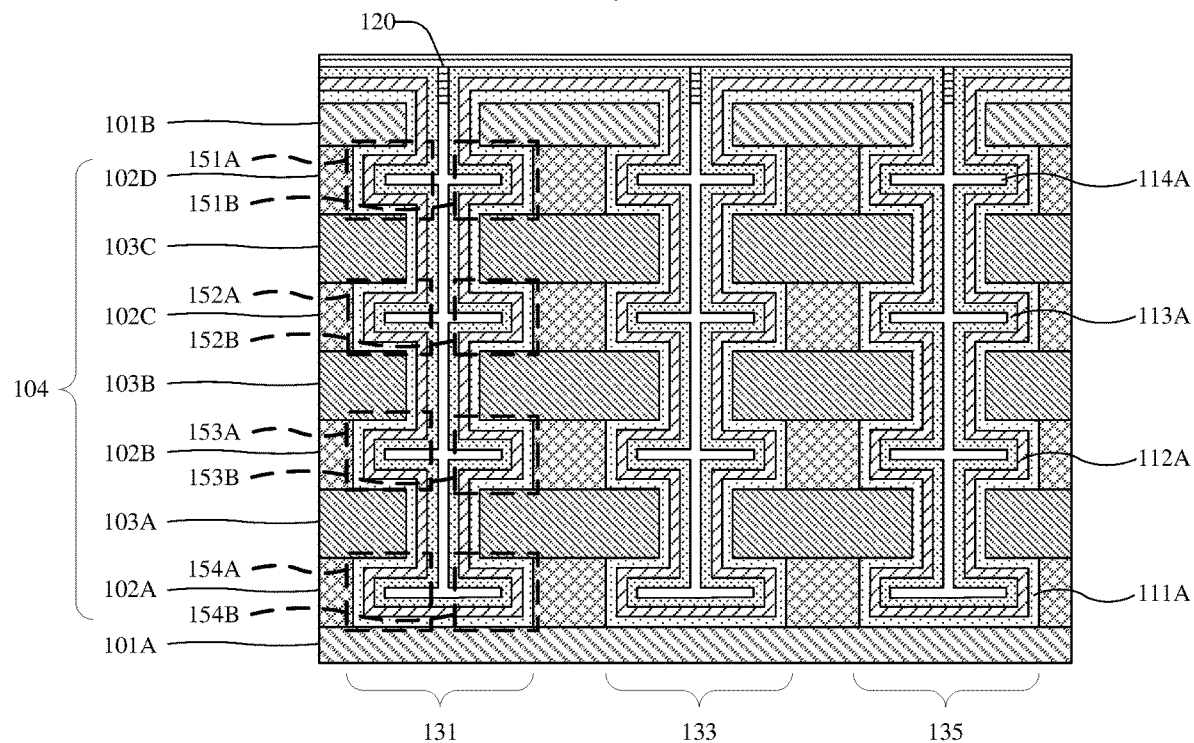

Referring FIG. 5D, a first outer electrode layer 111A is formed over the substrate 101A in the first set of trenches 181 and along the first set of lateral recesses 191. The first outer electrode layer 111A can be formed by chemical vapor deposition (CVD), plasma enhanced CVD (PECVD) or atomic layer deposition (ALD) for example. A first insulator layer 112A is then formed over and along the first outer electrode layer 111A, and can be formed by CVD, PECVD, or ALD for example. A first inner electrode layer 113A is then formed over and along the first insulator layer 112A and can be formed by CVD, PECVD, or ALD for example. Any of the deposition processes used to form any of the first outer electrode layer 111A, the first insulator layer 112A, and the first inner electrode layer 113A may be performed for predetermined times, thereby controlling the thicknesses of the resulting first outer electrode layer 111A, the resulting first insulator layer 112A, and/or the resulting first inner electrode layer 113A. The first outer electrode layer 111A and the first inner electrode layer 113A may be or comprise titanium, titanium nitride, tantalum, tantalum nitride, any other metal, or any other suitable material. The first insulator layer 112A may comprise silicon oxide, silicon nitride, hafnium oxide, aluminum oxide, zirconium oxide, some other dielectric, or any combination of the foregoing. The first outer electrode layer 111A and the first inner electrode layer 113A may have a thickness of 50 to 500 angstroms. Because of tight geometries involved, the material of the first inner electrode layer 113A may not entirely fill the space within the first insulator layer 112A, thereby leaving a first set of cavities 114A in the first inner electrode layer 113A. The first insulator layer 112A may have a thickness of 10 to 200 angstroms. A capping layer 120 is formed over the first set of cavities 114A, and can for example, hermetically seal the cavities. The capping layer 120 may comprise silicon oxide, silicon nitride, or any other dielectric material. The capping layer 120 may have a thickness of 50 to 1000 angstroms. In other embodiments, the first inner electrode layer 113A may fill the entire space within the first insulator layer 112A, such that the first set of cavities 114A are not present. In still other embodiments, small variations in the surface topography of the first insulator layer 112A may cause the first inner electrode layer 113A to "pinch off" the first set of cavities 114A at various locations, which can differ for different capacitor structures.

Figure 5E:
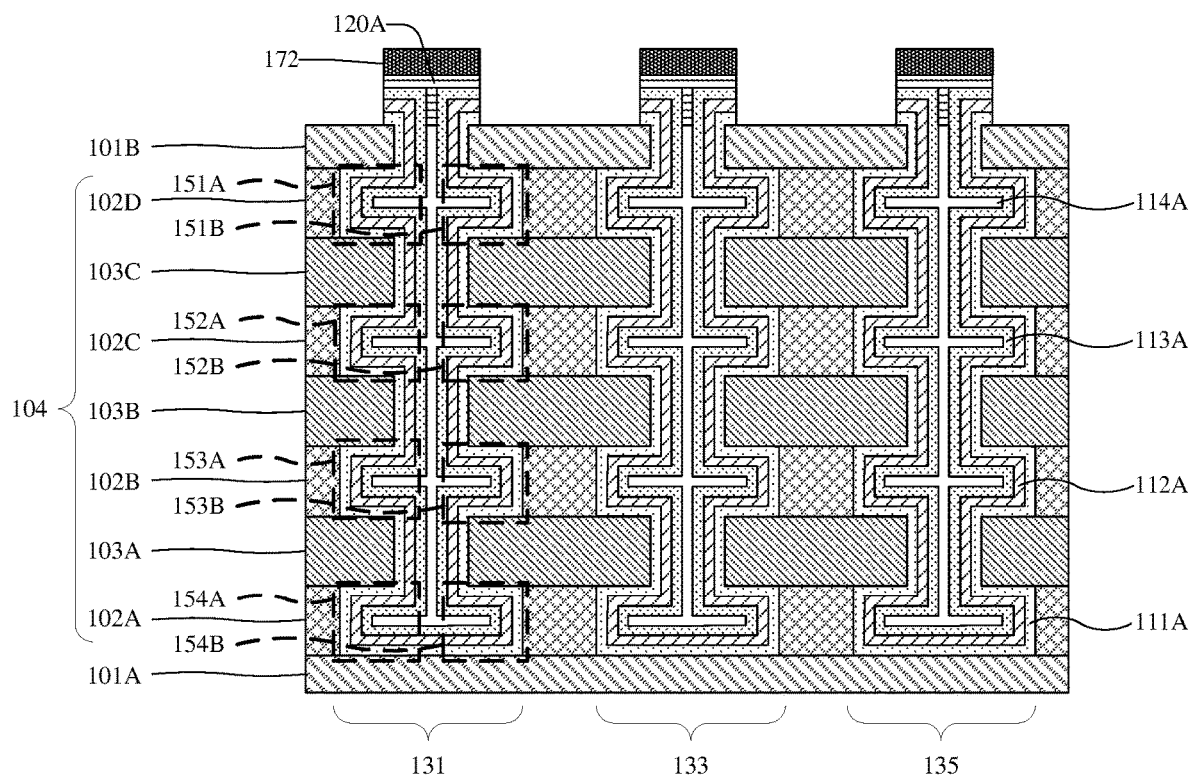

Referring to FIG. 5E, a second mask 172 is formed over the first capacitor structure 131, the third capacitor structure 133, the fifth capacitor structure 135 and the capping layer 120. The first capacitor structure 131, the third capacitor structure 133, the fifth capacitor structure 135 and the capping layer 120 are then patterned with the second mask 172 in place. The patterning forms a first patterned capping layer 120A. The patterning may comprise any of a wet etch or a dry etch. In some embodiments, the patterning comprises removing the second mask 172 after the etching process.

Figure 5F:
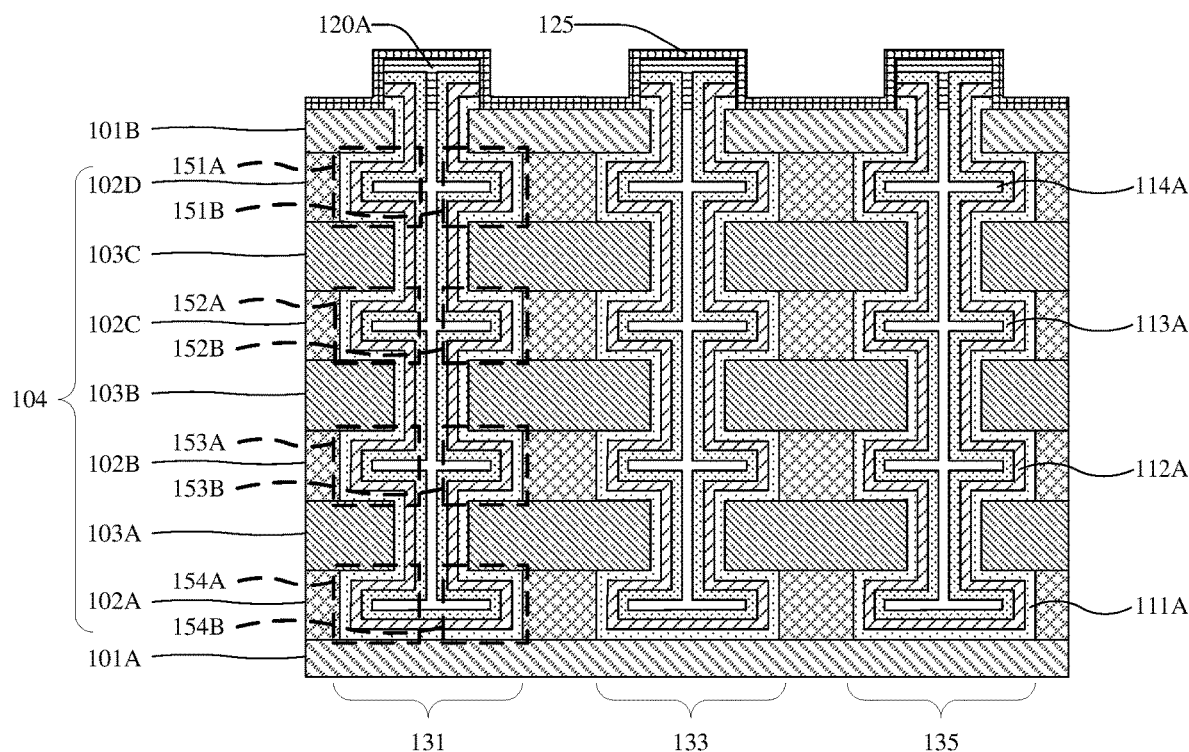

Referring to FIG. 5F, an isolation layer 125 is formed over the first patterned capping layer 120A. The isolation layer 125 may be a passivation layer. The isolation layer 125 may comprise silicon oxide, silicon nitride, or any other dielectric material. The isolation layer 125 may have a thickness of 50 to 1000 angstroms.

Figure 5G:
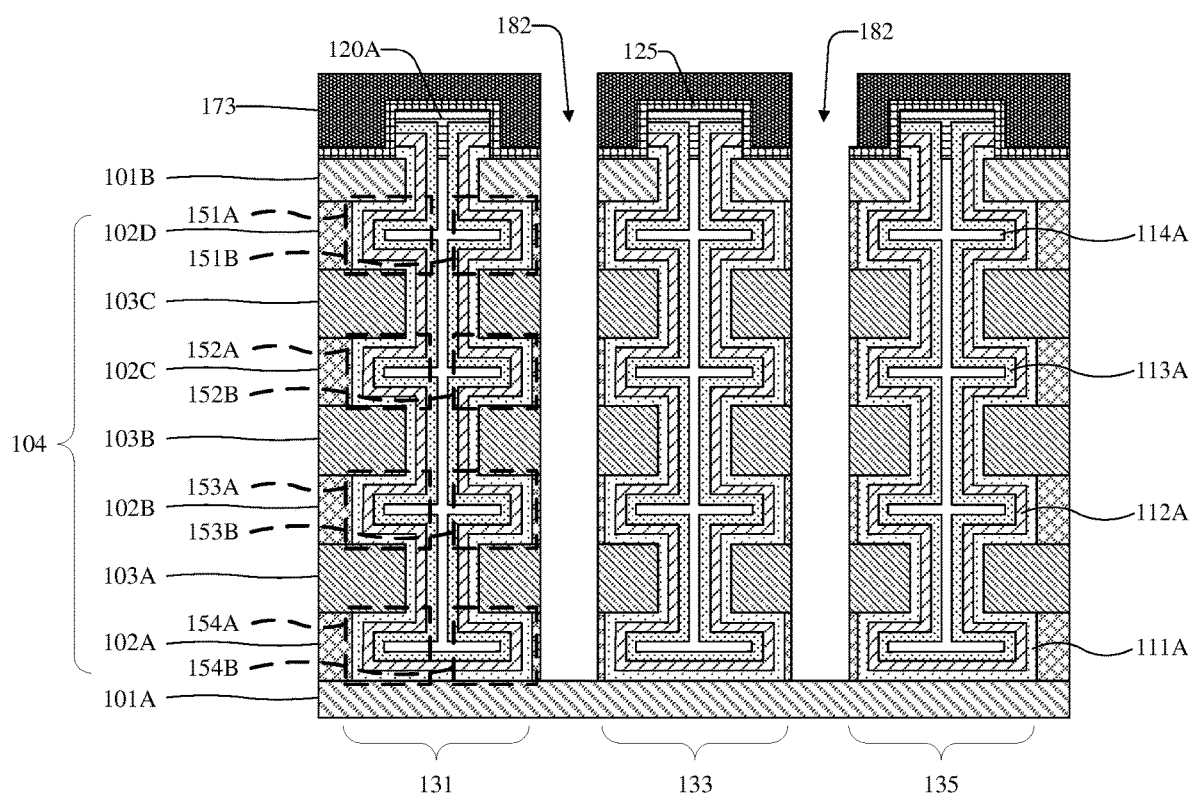

Referring to FIG. 5G, a third mask 173 is formed over isolation layer 125, the support layer 101B, the dielectric structure 104, and the substrate 101A. The isolation layer 125, the support layer 101B, and the dielectric structure 104 are then patterned with the third mask 173 in place to form a second set of trenches 182. The third mask 173 may comprise, for example, photoresist, silicon oxide, silicon nitride, some other mask material, or any combination of the foregoing. The patterning may comprise a dry etch. In some embodiments, the dry etch may utilize $CF_4$ plasma, $CHF_3$ plasma, $C_4F_8$ plasma, $SF_6$ plasma, $NF_3$ plasma, or some other plasma to pattern the dielectric structure 104. In some embodiments, the dry etch may utilize $Cl_2$ plasma, HBr plasma, Ar plasma, or some other plasma to pattern the support layer 101B.

Figure 5H:
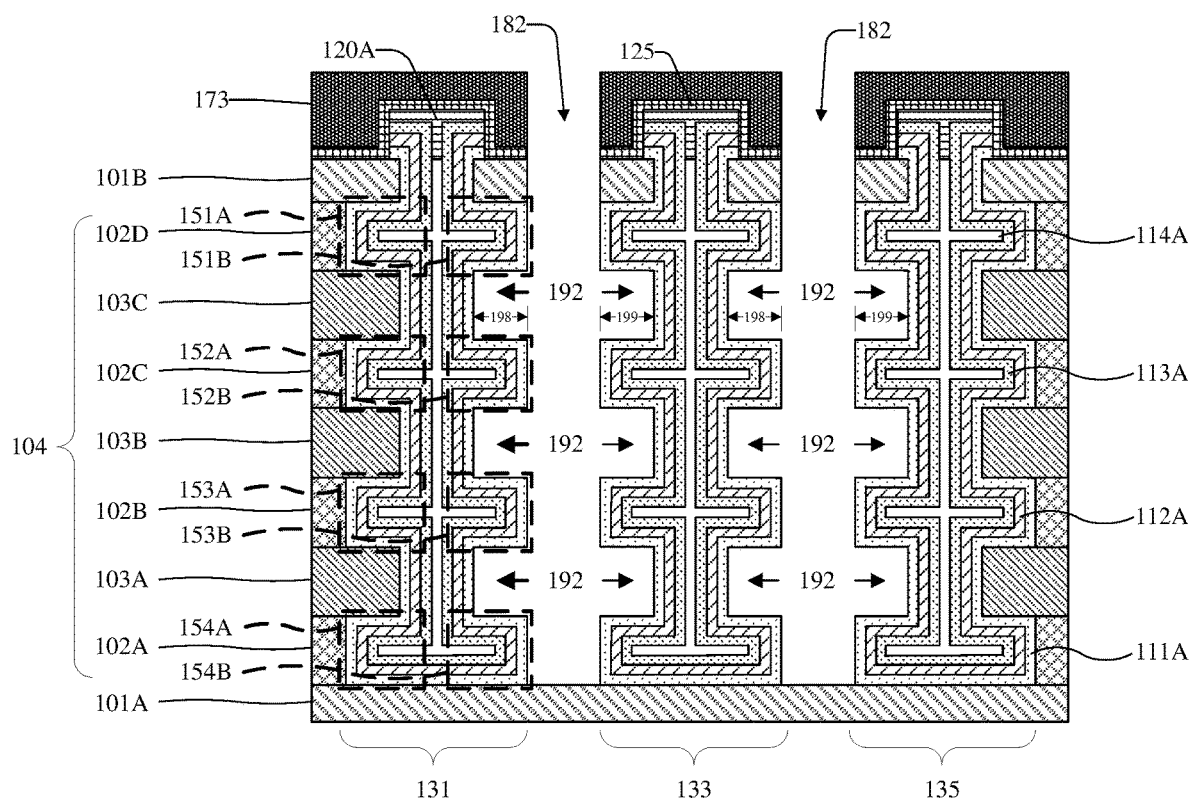

Referring to FIG. 5H, the dielectric structure 104 is patterned with the third mask 173 in place to form a second set of lateral recesses 192 that extend outward from the second set of trenches 182. The patterning may comprise a wet etch. The wet etch may be performed with high selectivity to the second set of dielectric layers 103A-C relative to the first set of dielectric layers 102A-D such that the etchant etches the second set of dielectric layers 103A-C faster than the first set of dielectric layers 102A-D to form the second set of lateral recesses 192. The wet etch may utilize HF, $H_3PO_4$, TMAH, $NH_4OH$, KOH, NaOH, some other etchant, or any combination of the foregoing to selectively etch the dielectric structure to form the second set of lateral recesses 192. The wet etch may be performed for a predetermined time to control a lateral distance in which the second set of lateral recesses 192 extend. In some embodiments, lateral recesses of the second set of lateral recesses 192 may be symmetric about their respective trenches of the second set of trenches 182 such that a third distance 198 at which the second set of lateral recesses 192 extend from the second set of trenches 182 is equal to a fourth distance 199 at which the second set of lateral recesses 192 extend from the second set of trenches 182. In some embodiments, the patterning comprises removing the third mask 173 after the etching process. Although FIG. 5H shows an example where the third mask 173 is left in place during the wet etch, in some alternative embodiments, the third mask 173 may be removed before the wet etch.

In some embodiments, the etch rates of the substrate 101A and the support layer 101B may be lower than that of the second dielectric material (e.g., 103A-C) during the wet etch. Thus, the wet etch may not extend the second set of trenches 182 vertically into the substrate 101A or laterally into the support layer 101B.

In some embodiments, sidewalls, upper surfaces, and lower surfaces of the first capacitor structure 131, the third capacitor structure 133, and the fifth capacitor structure 135 may be planar after the wet etch, such that the first capacitor structure 131, the third capacitor structure 133, and the fifth capacitor structure 135, have square corners or sharp corners as illustrated in FIG. 5H. However, it will be appreciated that the aforementioned sidewalls, corners, and/or surfaces may alternatively be curved or rounded as a result of the wet etch.

Figure 5I:
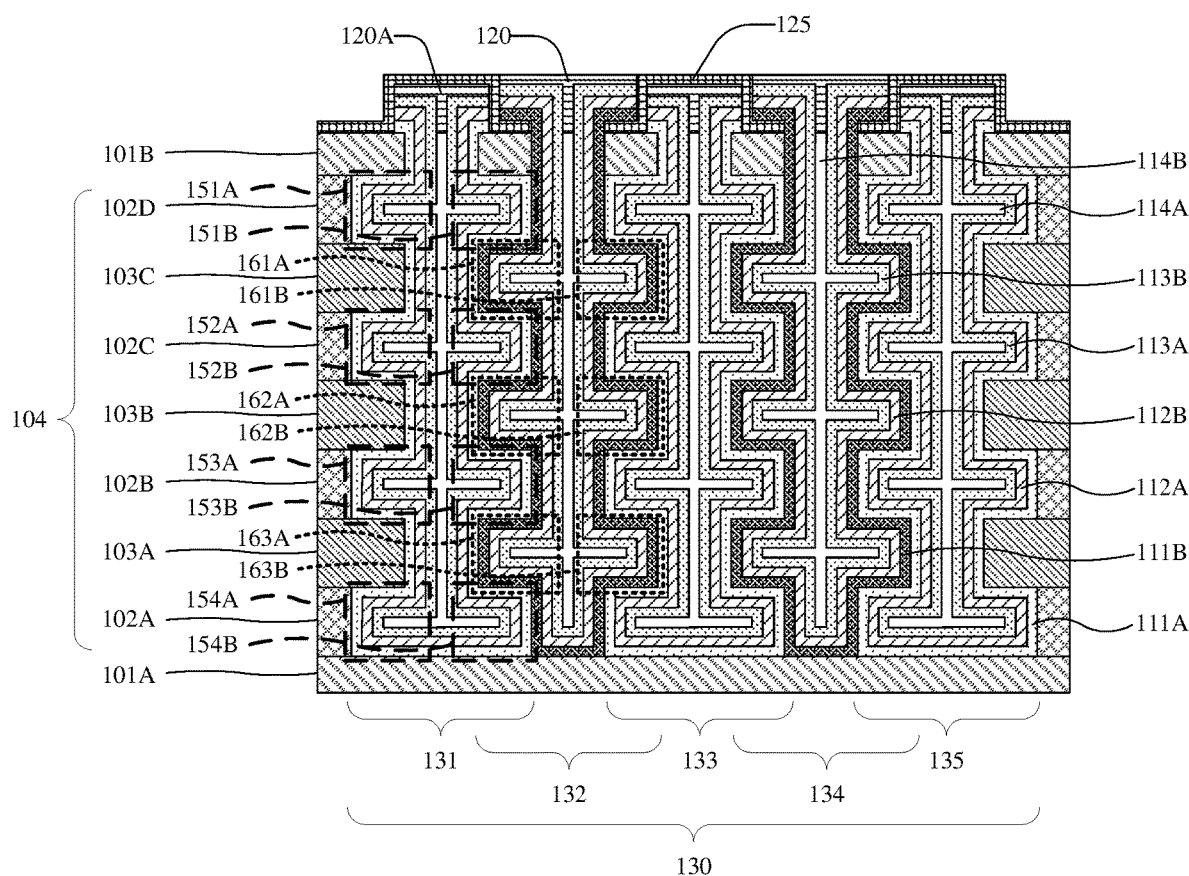

Referring to FIG. 5I, a second capacitor structure 132 and a fourth capacitor structure 134 are formed in the second set of trenches 182 and in the second set of lateral recesses 192. By forming the second capacitor structure 132 along the second set of lateral recesses 192, a third set of lateral protrusions 161A-163A and a fourth set of lateral protrusions 161B-163B are formed. The third set of lateral protrusions 161A-163A are interdigitated with the second set of lateral protrusions 151B-154B. The forming of the second capacitor structure 132, and the fourth capacitor structure 134 comprises forming a second outer electrode layer 111B over the substrate 101A in the second set of trenches 182 and along the second set of lateral recesses 192, forming a second insulator layer 112B over and along the second outer electrode layer 111B, and forming a second inner electrode layer 113B over and along the second insulator layer 112B. Any of the second outer electrode layer 111B, the second insulator layer 112B, and the second inner electrode layer 113B may be formed by ALD, CVD, PECVD, or any combination of the foregoing. Any of the deposition processes used to form any of the second outer electrode layer 111B, the second insulator layer 112B, and the second inner electrode layer 113B may be performed for predetermined times, thereby controlling the thicknesses of the resulting second outer electrode layer 111B, the resulting second insulator layer 112B, and/or the resulting second inner electrode layer 113B. The second outer electrode layer 111B and the second inner electrode layer 113B may be or comprise titanium, titanium nitride, tantalum, tantalum nitride, any other metal, or any other suitable material. The second insulator layer 112B may comprise silicon oxide, silicon nitride, hafnium oxide, aluminum oxide, zirconium oxide, some other dielectric, or any combination of the foregoing. The second outer electrode layer 111B and the second inner electrode layer 113B may have a thickness of 50 to 500 angstroms. The second insulator layer 112B may have a thickness of 10 to 200 angstroms.

In some embodiments, the first outer electrode layer 111A contacts the second outer electrode layer 111B at one or more locations after the forming of the second outer electrode layer 111B. For example, the first outer electrode layer 111A may contact the second outer electrode layer 111B along any of an interface between the first capacitor structure 131 and the second capacitor structure 132, an interface between the second capacitor structure 132 and the third capacitor structure 133, an interface between the third capacitor structure 133 and the fourth capacitor structure 134, and an interface between the fourth capacitor structure 134 and the fifth capacitor structure 135 after the forming of the second outer electrode layer 111B.

A capping layer 120 is formed over a second set of cavities 114B. The capping layer 120 may hermetically seal the second set of cavities 114B. The capping layer 120 may comprise silicon oxide, silicon nitride, or any other dielectric material. The capping layer 120 may have a thickness of 50 to 1000 angstroms.

Figure 5J:
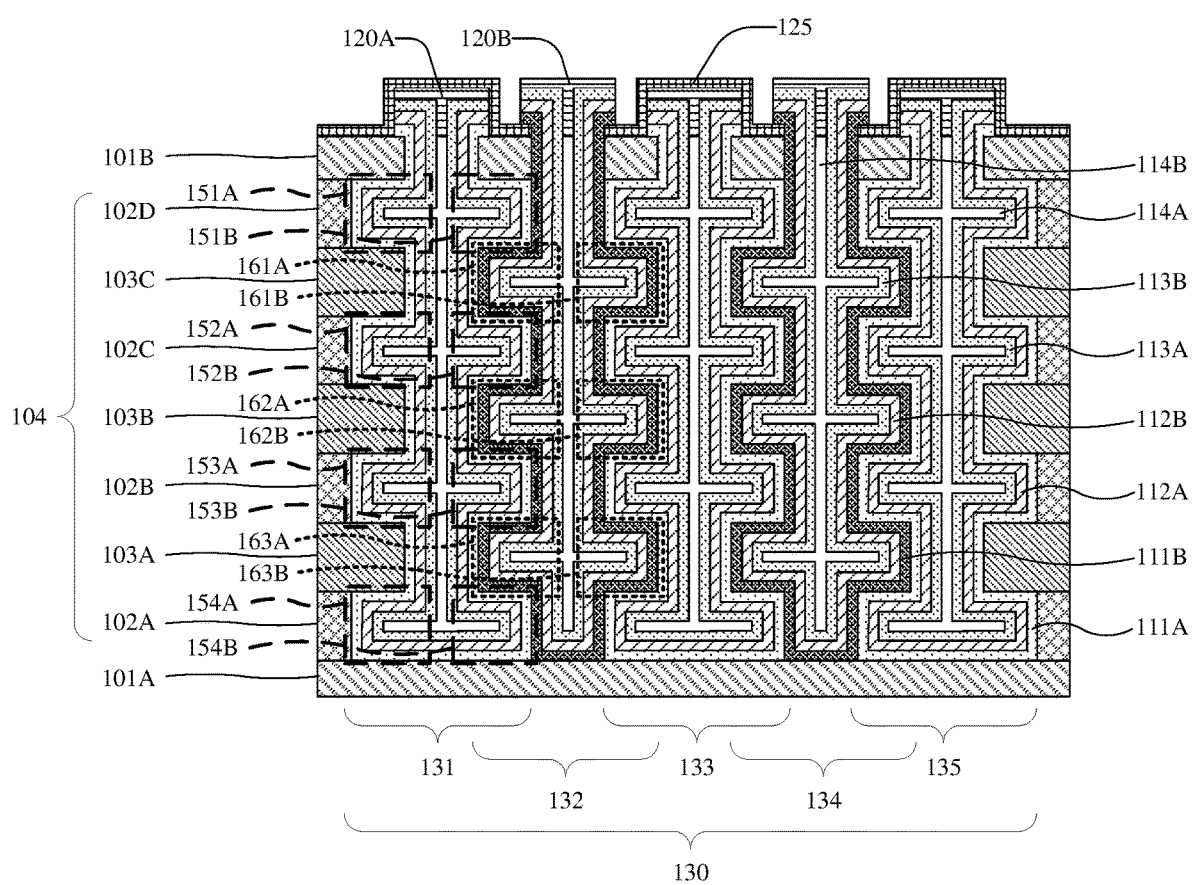

Referring to FIG. 5J, a fourth mask 174 is formed over the semiconductor device 100. The second capacitor structure 132, the fourth capacitor structure 134 and the capping layer 120 are then patterned with the fourth mask 174 in place. The patterning forms a second patterned capping layer 120B. The patterning may comprise any of a wet etch or a dry etch. In some embodiments, the patterning comprises removing the fourth mask 174 after the etching process.

Referring to FIGS. 6A-6H, a series of cross-sectional views of some embodiments of a method for forming the semiconductor device 200 of FIGS. 3 and 4 is provided. The semiconductor device 200 may be or comprise an IC, an IPD, or some other semiconductor device.

Figure 6A:
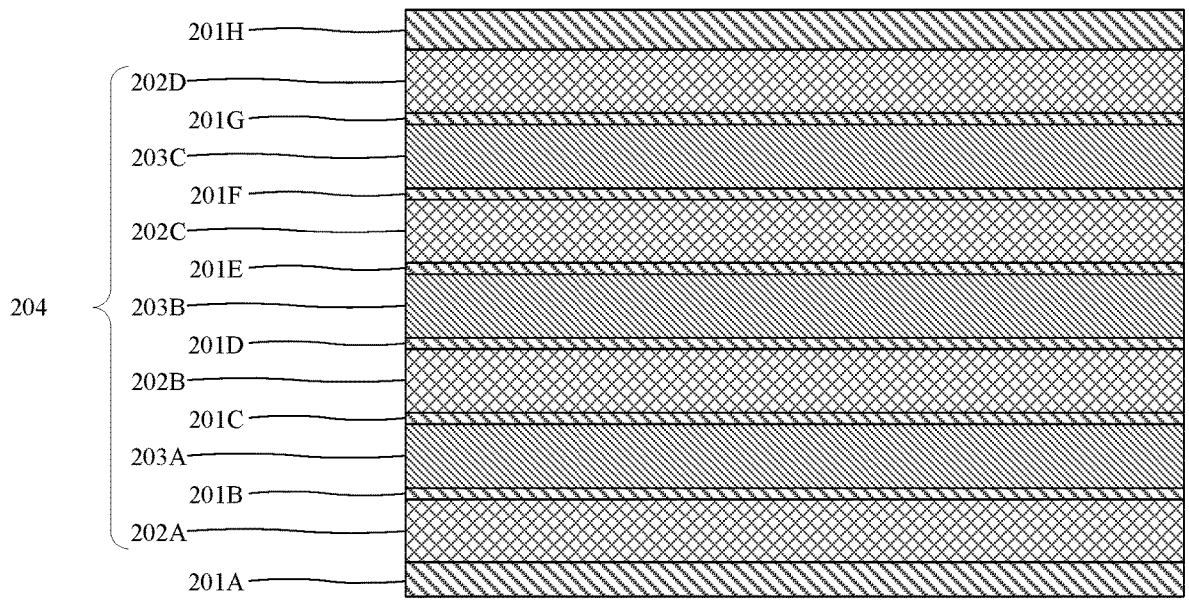
FIGS. 6A-6H illustrate a series of cross-sectional views of some embodiments of a method for forming the semiconductor device of FIGS. 3A, 3B, and 4.

Referring to FIG. 6A, a dielectric structure 204 is formed over a substrate 201A. The dielectric structure 204 includes a plurality of dielectric layers 202A-D/103A-C and a plurality of support layers 201B-201G. The substrate 201A may be or comprise silicon, germanium, any III-V compound, or any other suitable semiconductor material. The substrate 201A may have a thickness of 50 angstroms or more. The plurality of dielectric layers 202A-D/203A-C includes a first set of dielectric layers 202A-D and a second set of dielectric layers 203A-C. The first set of dielectric layers 202A-D and the second set of dielectric layers 203A-C may be formed one over the other in an alternating fashion. The first set of dielectric layers 202A-D and the second set of dielectric layers 203A-C may comprise silicon oxide, silicon nitride, silicon carbide, silicon oxynitride, or any other suitable dielectric material. The first set of dielectric layers 202A-D may comprise different materials than the second set of dielectric layers 203A-C. Each layer of the first set of dielectric layers 202A-D and the second set of dielectric layers 203A-C may have a thickness of 50 angstroms to 20 micrometers. The plurality of support layers 201B-201G may comprise polysilicon. The plurality of support layers may comprise the same material(s) as the substrate 201A. The plurality of support layers 201B-201G may be layered in between each layer of the plurality of dielectric layers 202A-D/203A-C such that each support layer of the plurality of support layers 201B-G is vertically disposed between a layer of the first set of dielectric layers 202A-D and a layer of the second set of dielectric layers 203A-C. For example, a first support layer 201B may be vertically disposed between a first dielectric layer 202A of the first set of dielectric layers 202A-D and a second dielectric layer 203A of the second set of dielectric layers 203A-C. A top support layer 201H is formed over the plurality of dielectric layers 202A-D/203A-C. The top support layer 201H may be or comprise polysilicon. The top support layer 201H may comprise the same or different materials as the substrate 201A. The top support layer 201H may have a thickness of 50 to 1000 angstroms.

Figure 6B:
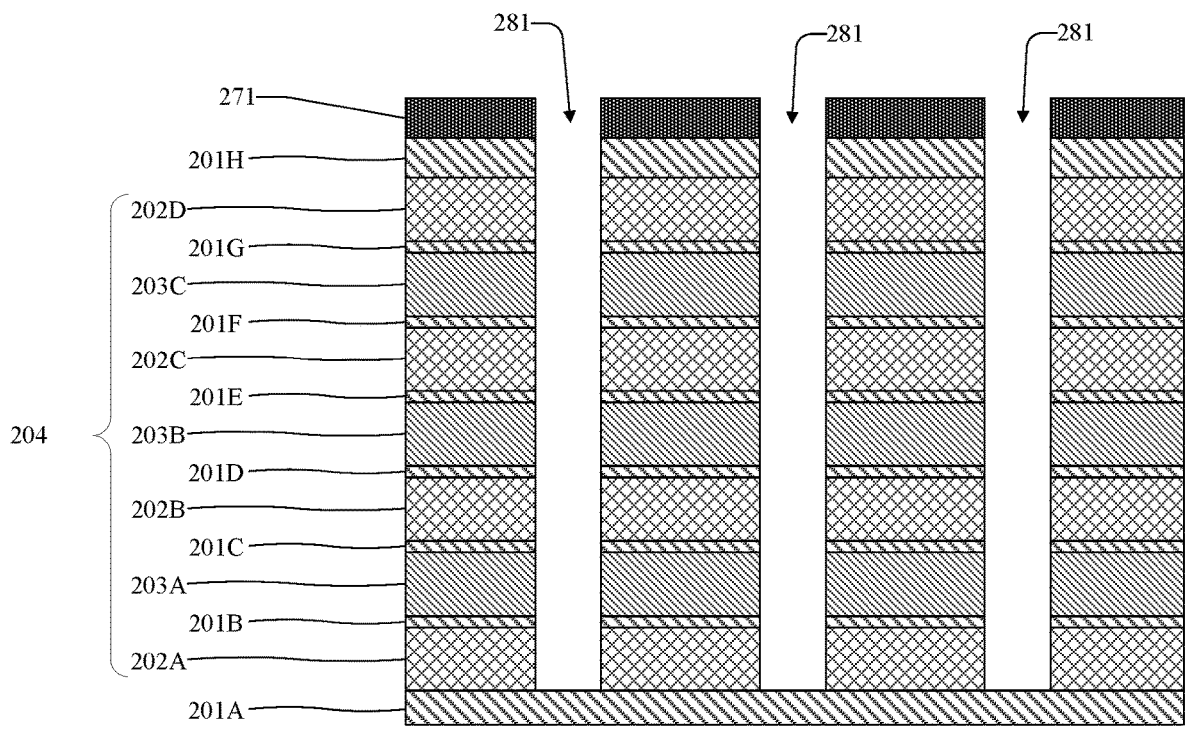

Referring to FIG. 6B, a first mask 271 is formed over the dielectric structure 204, and the substrate 201A. The dielectric structure 204 is then patterned with the first mask 271 in place to form a first set of trenches 281. The first mask 271 may comprise, for example, photoresist, silicon oxide, silicon nitride, some other mask material, or any combination of the foregoing. The patterning may comprise a dry etch. In some embodiments, the dry etch may utilize $CF_4$ plasma, $CHF_3$ plasma, $C_4F_8$ plasma, $SF_6$ plasma, $NF_3$ plasma, or some other plasma to pattern the plurality of dielectric layers structure. In some embodiments, the dry etch may utilize $Cl_2$ plasma, HBr plasma, Ar plasma, or some other plasma to pattern the plurality of support layers 201B-H.

Figure 6C:
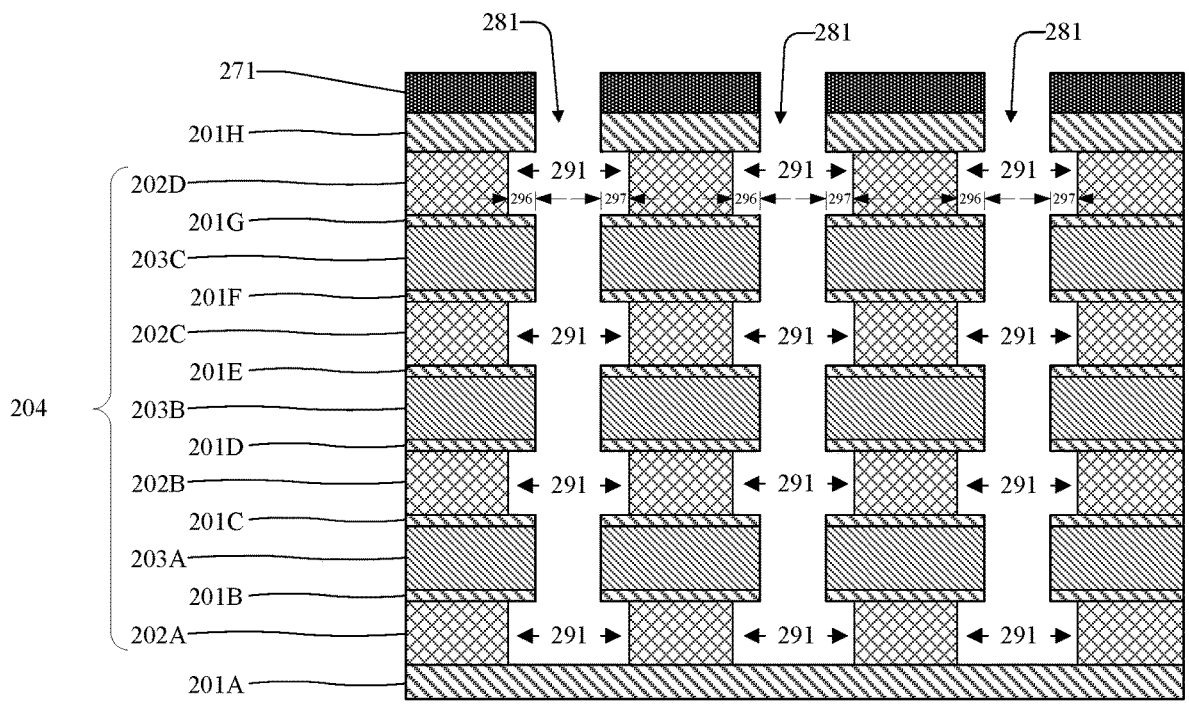

Referring to FIG. 6C, the dielectric structure 204 is patterned with the first mask 271 in place to form a first set of lateral recesses 291 that extend outward from the first set of trenches 281. The patterning may comprise a wet etch. The wet etch may be performed with high selectivity to the first set of dielectric layers 202A-D relative to the second set of dielectric layers 203A-C such that the etchant etches the first set of dielectric layers 202A-D faster than the second set of dielectric layers 203A-C to form the first set of lateral recesses 291. The wet etch may utilize HF, $H_3PO_4$, TMAH, $NH_4OH$, KOH, NaOH, some other etchant, or any combination of the foregoing to selectively etch the dielectric structure to form the first set of lateral recesses 291. The wet etch may be performed for a predetermined time to control a lateral distance in which the first set of lateral recesses 291 extend. In some embodiments, lateral recesses of the first set of lateral recesses 291 may be symmetric about their respective trenches of the first set of trenches 281 such that a first distance 296 at which the first set of lateral recesses 291 extend from the first set of trenches 281 is equal to a second distance 297 at which the first set of lateral recesses 291 extend from the first set of trenches 281. In some embodiments, the patterning comprises removing the first mask 271 after the wet etch. Although FIG. 6C shows an example where the first mask 271 is left in place during the wet etch, in some alternative embodiments, the first mask 271 may be removed before the wet etch.

In some embodiments, etch rates of the substrate 201A and the plurality of support layers 201B-201G may be lower than that of the first dielectric material (e.g., 202A-D) such that the wet etchant may also etch the first set of dielectric layers 202A-D faster than the substrate 201A and the plurality of support layers 201B-201G. As a result, the wet etch may not extend the first set of trenches 281 vertically into the substrate 201A or laterally into the plurality of support layers 201B-201G.

In some embodiments, sidewalls of the first set of dielectric layers 202A-D may be planar after the wet etch, as illustrated in FIG. 6C. In addition, sidewalls, upper surfaces, and lower surfaces of the second set of dielectric layers 203A-C and/or the plurality of support layers 201B-201G may be planar after the wet etch, such that the first set of lateral recesses 291 have square corners or sharp corners as illustrated in FIG. 6C. However, it will be appreciated that the aforementioned sidewalls, corners, and/or surfaces may alternatively be curved or rounded as a result of the wet etch.

Figure 6D:
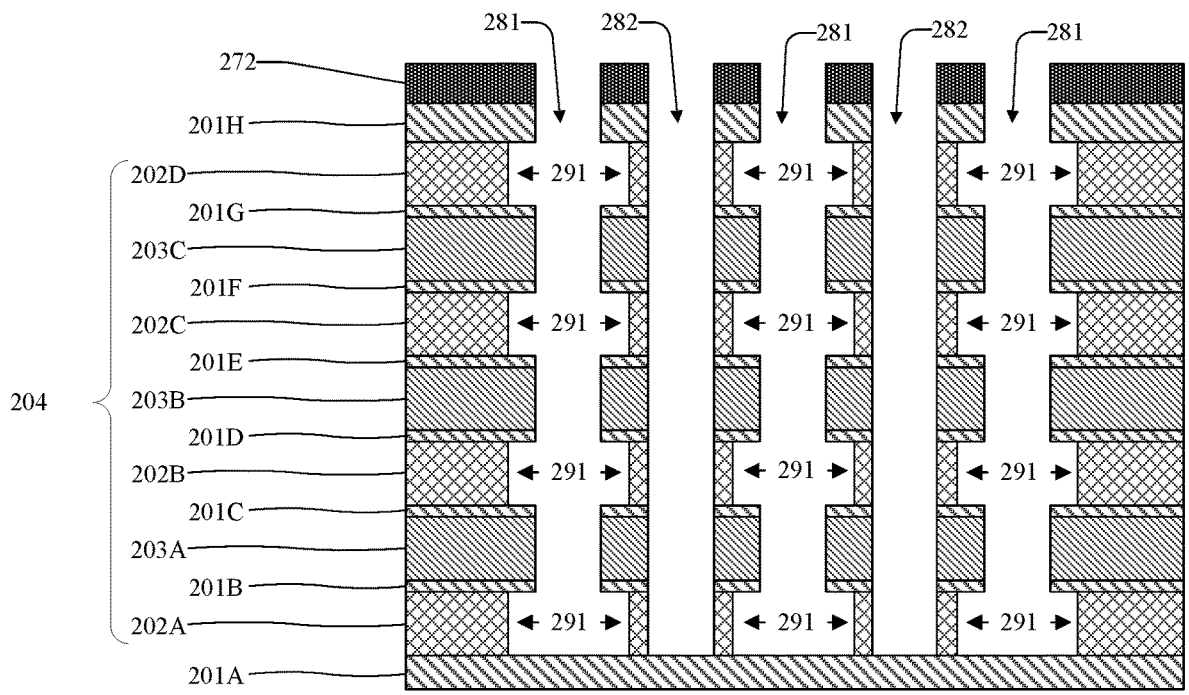

Referring to FIG. 6D, a second mask 272 is formed over the dielectric structure 204. The dielectric structure 204 is then patterned with the second mask 172 in place to form a second set of trenches 282. The second mask 272 may comprise, for example, photoresist, silicon oxide, silicon nitride, some other mask material, or any combination of the foregoing. The patterning may comprise a dry etch. In some embodiments, the dry etch may utilize $CF_4$ plasma, $CHF_3$ plasma, $C_4F_8$ plasma, $SF_6$ plasma, $NF_3$ plasma, or some other plasma to pattern the dielectric structure 204. In some embodiments, the dry etch may utilize $Cl_2$ plasma, HBr plasma, Ar plasma, or some other plasma to pattern the plurality of support layers 201B-201G.

Figure 6E:
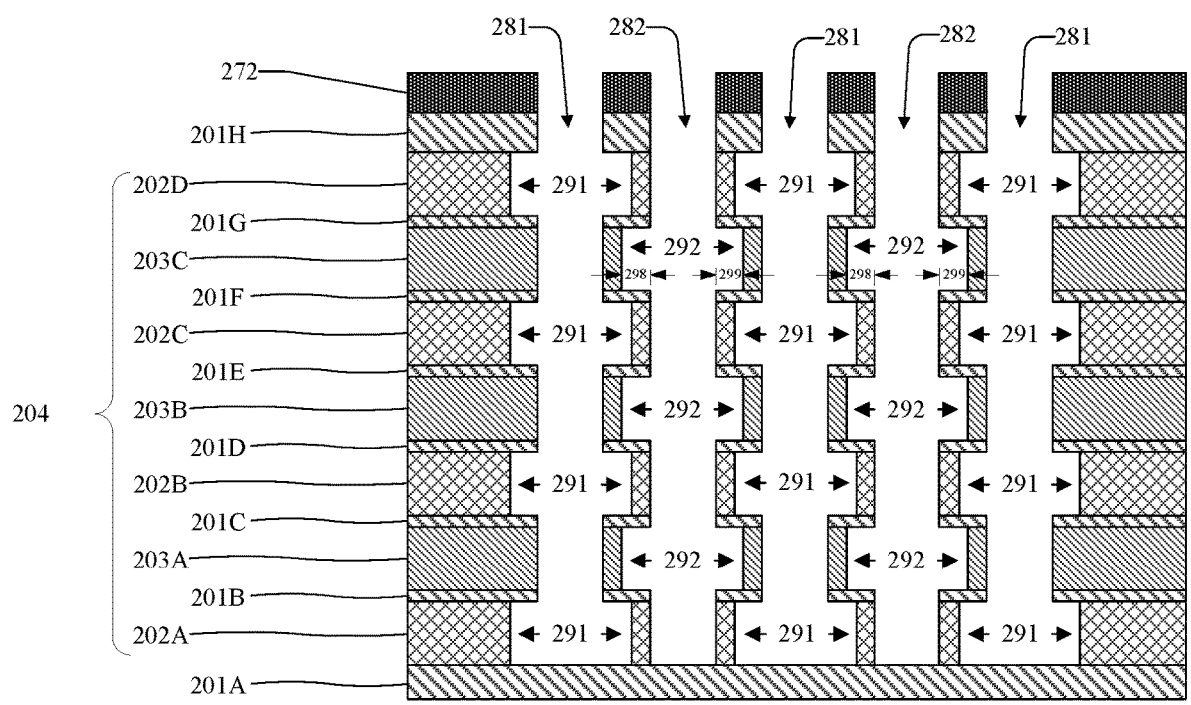

Referring to FIG. 6E, the dielectric structure 204 is patterned with the second mask 272 in place to form a second set of lateral recesses 292 that extend outward from the second set of trenches 282. The patterning may comprise a wet etch. The wet etch may be performed with high selectivity to the second set of dielectric layers 203A-C relative to the first set of dielectric layers 202A-D such that the etchant etches the second set of dielectric layers 203A-C faster than the first set of dielectric layers 202A-D to form the second set of lateral recesses 292. The wet etch may utilize HF, $H_3PO_4$, TMAH, $NH_4OH$, KOH, NaOH, some other etchant, or any combination of the foregoing to selectively etch the dielectric structure to form the second set of lateral recesses 292. The wet etch may be performed for a predetermined time to control a lateral distance in which the second set of lateral recesses 292 extend. In some embodiments, lateral recesses of the second set of lateral recesses 292 may be symmetric about their respective trenches of the second set of trenches 282 such that a third distance 298 at which the second set of lateral recesses 292 extend from the second set of trenches 282 is equal to a fourth distance 299 at which the second set of lateral recesses 292 extend from the second set of trenches 282. In some embodiments, the patterning comprises removing the second mask 272 after the wet etch. Although FIG. 6E shows an example where the second mask 272 is left in place during the wet etch, in some alternative embodiments, the second mask 272 may be removed before the wet etch.

In some embodiments, the etch rates of the substrate 201A and the plurality of support layers 201B-201G may be lower than that of the second dielectric material (e.g., 203A-C) during the wet etch. Thus, the wet etch may not extend the second set of trenches 282 vertically into the substrate 201A or laterally into the plurality of support layers 201B-201G.

In some embodiments, sidewalls of the second set of dielectric layers 203A-C may be planar after the wet etch, as illustrated in FIG. 6E. In addition, sidewalls, upper surfaces, and lower surfaces of the first set of dielectric layers 202A-D and/or the plurality of support layers 201B-201G may be planar after the wet etch, such that the second set of lateral recesses 292 have square corners or sharp corners as illustrated in FIG. 6E. However, it will be appreciated that the aforementioned sidewalls, corners, and/or surfaces may alternatively be curved or rounded as a result of the wet etch.

Figure 6F:
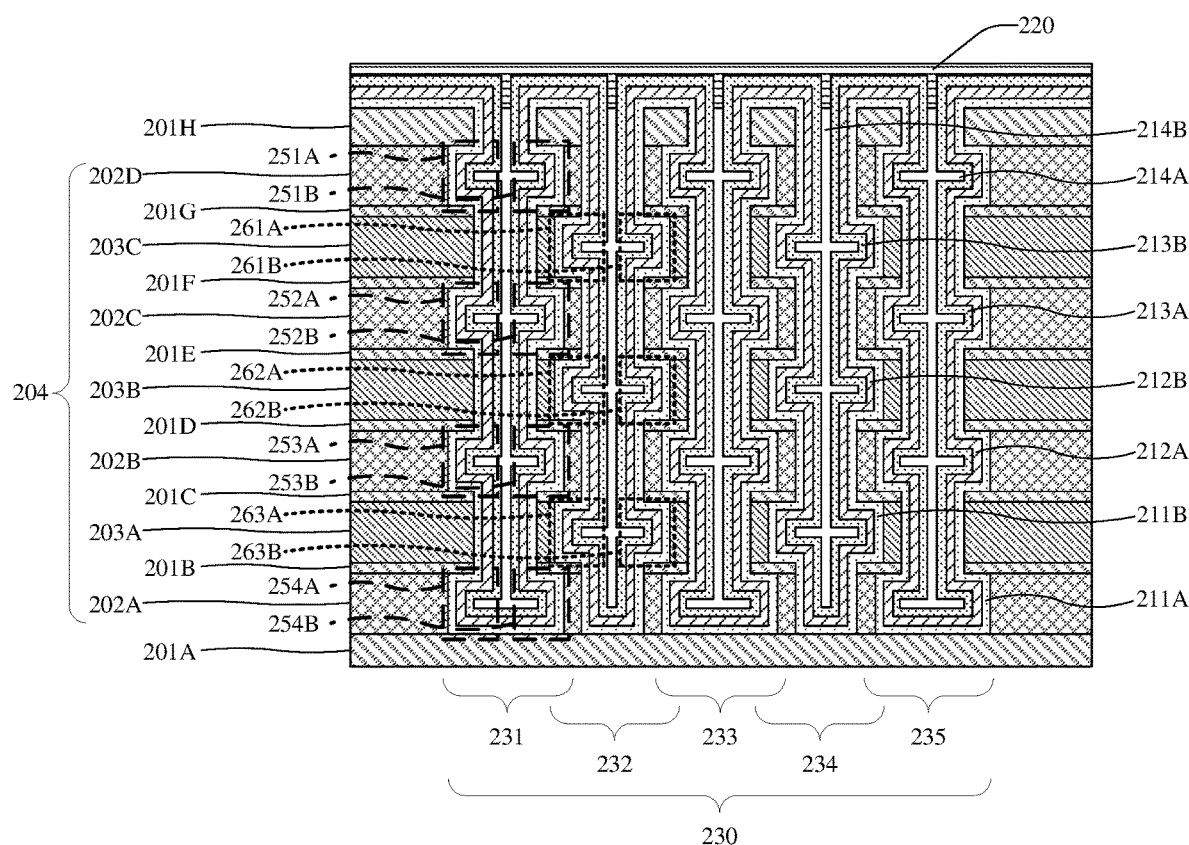

Referring to FIG. 6F, a first capacitor structure 231, a second capacitor structure 232, a third capacitor structure 233, a fourth capacitor structure 234, and a fifth capacitor structure 235 are formed in the first set of trenches 281, in the first set of lateral recesses 291, in the second set of trenches 282, and in the second set of lateral recesses 292. For example, by forming the first capacitor structure 231 along the first set of lateral recesses 291, a first set of lateral protrusions 251A-254A and a second set of lateral protrusions 251B-254B are formed. For example, by forming the second capacitor structure 232 along the second set of lateral recesses 292, a third set of lateral protrusions 261A-263A and a fourth set of lateral protrusions 261B-263B are formed. In some embodiments, the second set of lateral protrusions 251B-254B and the third set of lateral protrusions 261A-263A are interdigitated The forming of the first capacitor structure 231, the third capacitor structure 233, and the fifth capacitor structure 235 comprises forming a first outer electrode layer 211A over the substrate 101A in the first set of trenches 281 and along the first set of lateral recesses 291, forming a first insulator layer 212A over and along the first outer electrode layer 211A, and forming a first inner electrode layer 213A over and along the first insulator layer 212A. Any of the first outer electrode layer 211A, the first insulator layer 212A, and the first inner electrode layer 213A may be formed by ALD, CVD, PECVD, or any combination of the foregoing. Any of the deposition processes used to form any of the first outer electrode layer 211A, the first insulator layer 212A, and the first inner electrode layer 213A may be performed for predetermined times, thereby controlling the thicknesses of the resulting first outer electrode layer 211A, the resulting first insulator layer 212A, and/or the resulting first inner electrode layer 213A. The first outer electrode layer 211A and the first inner electrode layer 213A may be or comprise titanium, titanium nitride, tantalum, tantalum nitride, any other metal, or any other suitable material. The first insulator layer 212A may comprise silicon oxide, silicon nitride, hafnium oxide, aluminum oxide, zirconium oxide, some other dielectric, or any combination of the foregoing. The first outer electrode layer 111A and the first inner electrode layer 113A may have a thickness of 50 to 500 angstroms. The first insulator layer 112A may have a thickness of 10 to 200 angstroms.

The forming of the second capacitor structure 232 and the fourth capacitor structure 234 comprises forming a second outer electrode layer 211B over the substrate 201A in the second set of trenches 282 and along the second set of lateral recesses 292, forming a second insulator layer 212B over and along the second outer electrode layer 211B, and forming a second inner electrode layer 213B over and along the second insulator layer 212B. Any of the second outer electrode layer 211B, the second insulator layer 212B, and the second inner electrode layer 213B may be formed by ALD, CVD, PECVD, or any combination of the foregoing. Any of the deposition processes used to form any of the second outer electrode layer 211B, the second insulator layer 212B, and the second inner electrode layer 213B may be performed for predetermined times, thereby controlling the thicknesses of the resulting second outer electrode layer 211B, the resulting second insulator layer 212B, and/or the resulting second inner electrode layer 213B. The second outer electrode layer 211B and the second inner electrode layer 213B may be or comprise titanium, titanium nitride, tantalum, tantalum nitride, any other metal, or any other suitable material. The second insulator layer 212B may comprise silicon oxide, silicon nitride, hafnium oxide, aluminum oxide, zirconium oxide, some other dielectric, or any combination of the foregoing. The second outer electrode layer 211B and the second inner electrode layer 213B may have a thickness of 50 to 500 angstroms. The second insulator layer 212B may have a thickness of 10 to 200 angstroms.

In some embodiments, the first outer electrode layer 211A is laterally separated from the second outer electrode layer 211B by the plurality of dielectric layers 202A-D/203A-C at one or more locations after the forming of the first outer electrode layer 211A and the second outer electrode layer 211B. In some embodiments, the first outer electrode layer 211A is vertically separated from the second outer electrode layer 211B by the plurality of support layers 201B-H at one or more locations. For example, the first outer electrode layer 211A may be separated from the second outer electrode layer 211B by the dielectric structure 204 along any of an interface between the first capacitor structure 231 and the second capacitor structure 232, an interface between the second capacitor structure 232 and the third capacitor structure 233, an interface between the third capacitor structure 233 and the fourth capacitor structure 234, and an interface between the fourth capacitor structure 234 and the fifth capacitor structure 235 after the forming of the first outer electrode layer 211A and the second outer electrode layer 211B.

In some embodiments, a capping layer 220 is formed over the first set of cavities 214A and the second set of cavities 214B. The capping layer 220 may hermetically seal the first set of cavities 214A and the second set of cavities 114B. The capping layer 220 may comprise silicon oxide, silicon nitride, or any other dielectric material. The capping layer 220 may have a thickness of 50 to 1000 angstroms.

Figure 6G:
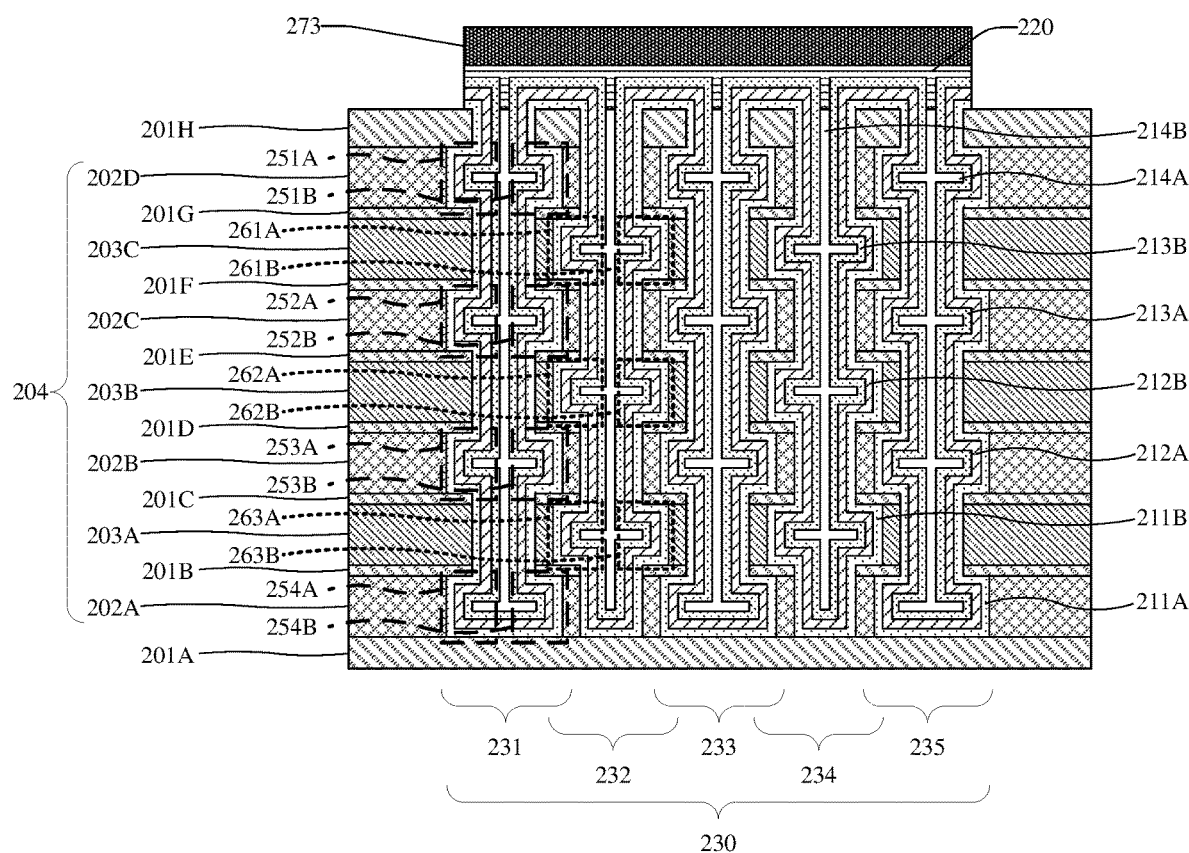

Referring to FIG. 6G, a third mask 273 is formed over the capping layer 220. The first capacitor structure 231, the fifth capacitor structure 235, and the capping layer 220 are then patterned. The patterning may comprise any of a wet etch or a dry etch. In some embodiments, the patterning comprises removing the third mask 273 after the etching process.

Figure 6H:
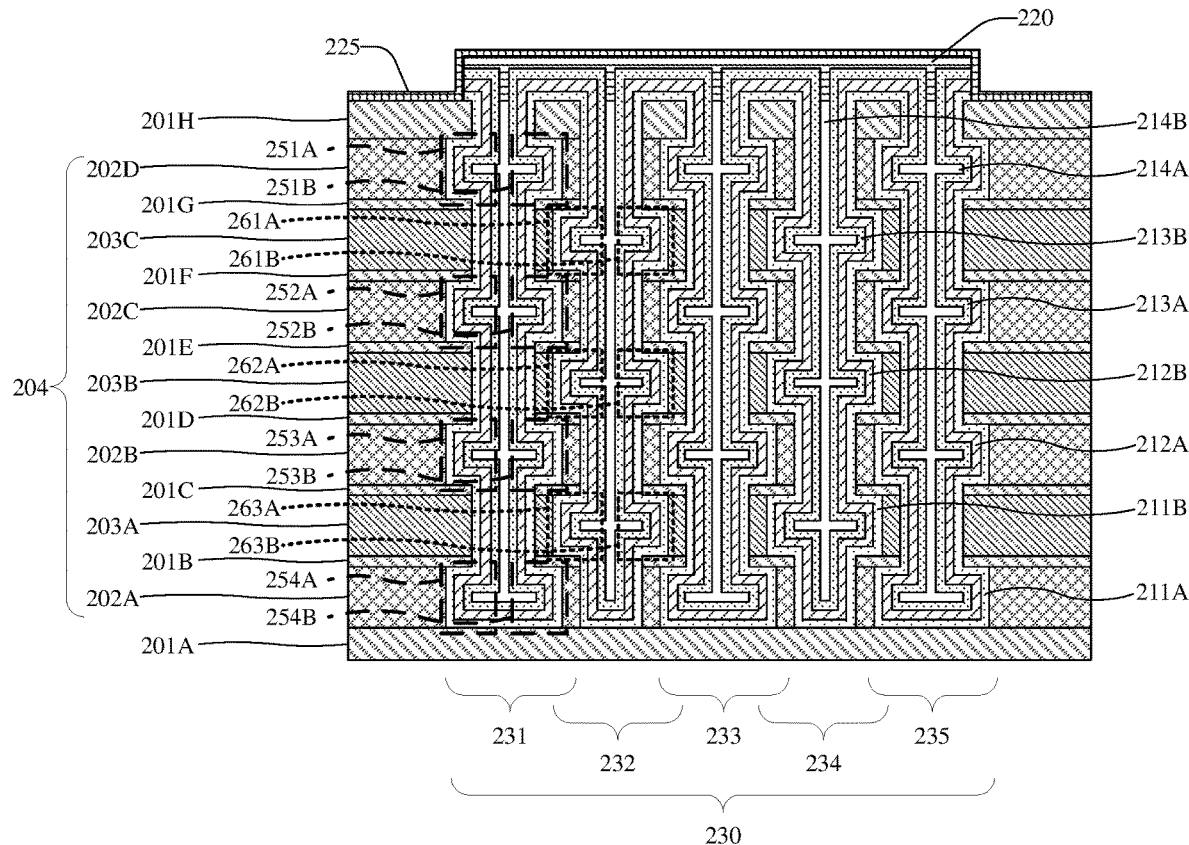

Referring to FIG. 6H, an isolation layer 225 is formed on an upper surface of the capping layer 220 and on an upper surface of the top support layer 201H. The isolation layer 225 may be a passivation layer. The isolation layer 225 may comprise silicon oxide, silicon nitride, or any other dielectric material. The isolation layer 225 may have a thickness of 50 to 1000 angstroms.

Figure 7:
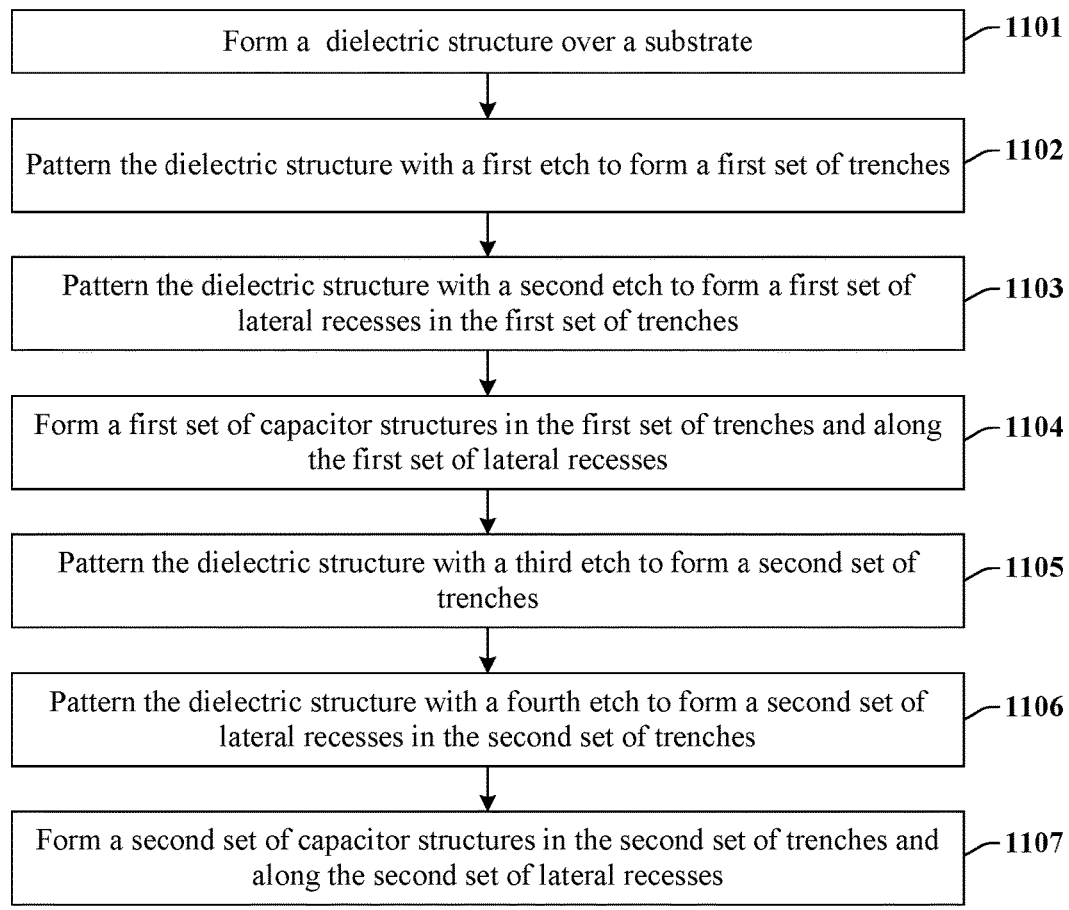
FIGS. 7 and 8 illustrate flowcharts of some embodiments of the methods of FIGS. 5A-5J and FIGS. 6A-6H, respectively.

Referring to FIG. 7, a flowchart of some embodiments of the method of FIGS. 5A-5J is provided.

At step 1101, a dielectric structure 104 is formed over a substrate 101A. See, for example, FIG. 5A.

At step 1102, the dielectric structure 104 is patterned with a first etch to form a first set of trenches 181. See, for example, FIG. 5B.

At step 1103, the dielectric structure 104 is patterned with a second etch to form a first set of lateral recesses 191 in the first set of trenches 181. See, for example, FIG. 5C.

At step 1104, a first set of capacitor structures 131/133/135 is formed in the first set of trenches 181 and along the first set of lateral recesses 191. See, for example, FIG. 5D.

At step 1105, the dielectric structure 104 is patterned with a third etch to form a second set of trenches 182. See, for example, FIG. 5G.

At step 1106, the dielectric structure 104 is patterned with a fourth etch to form a second set of lateral recesses 192 in the second set of trenches 182. See, for example, FIG. 5H.

At step 1107, a second set of capacitor structures 132/134 is formed in the second set of trenches 182 and along the second set of lateral recesses 192. See, for example, FIG. 5I.

While the block diagram 1100 of FIG. 7 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 8:
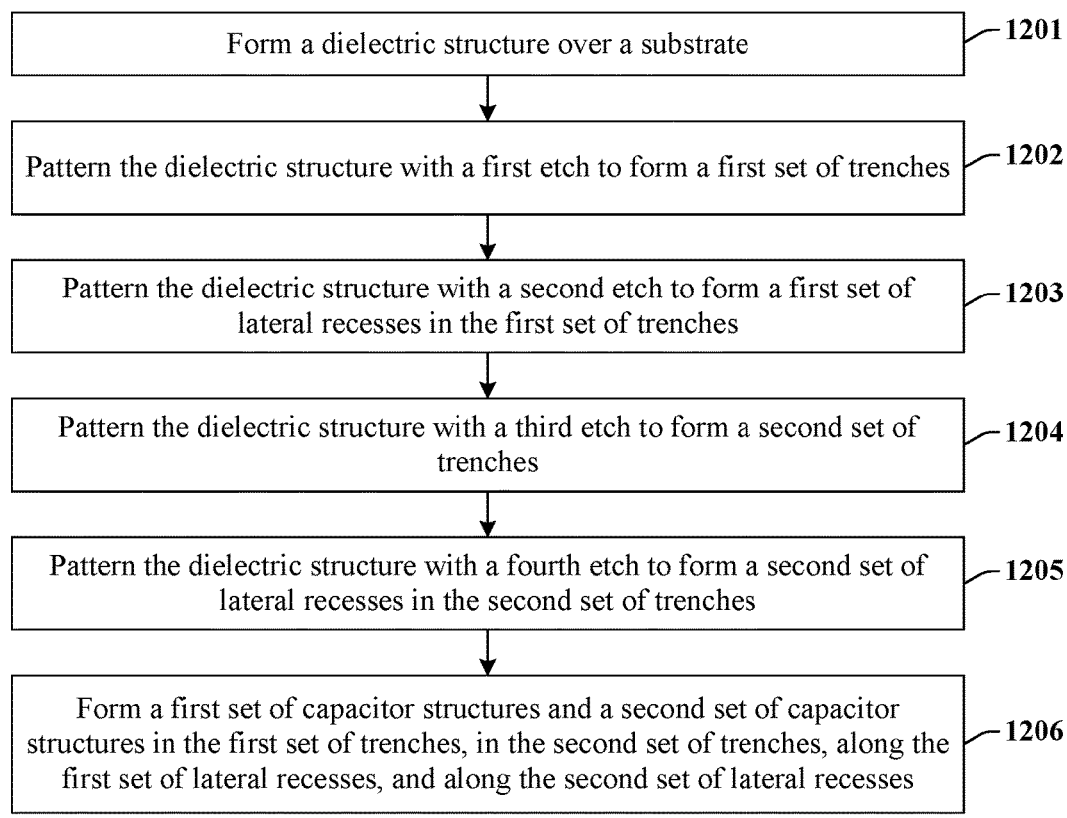

Referring to FIG. 8, a flowchart of some embodiments of the method of FIGS. 6A-6H is provided.

At step 1201, a dielectric structure 204 is formed over a substrate 201A. See, for example, FIG. 6A.

At step 1202, the dielectric structure 204 is patterned with a first etch to form a first set of trenches 281. See, for example, FIG. 6B.

At step 1203, the dielectric structure 204 is patterned with a second etch to form a first set of lateral recesses 291 in the first set of trenches 281. See, for example, FIG. 6C.

At step 1204, the dielectric structure 204 is patterned with a third etch to form a second set of trenches 282. See, for example, FIG. 6D.

At step 1205, the dielectric structure 204 is patterned with a fourth etch to form a second set of lateral recesses 292 in the second set of trenches 282. See, for example, FIG. 6E.

At step 1206, a first set of capacitor structures 231/233/235 and a second set of capacitor structures 232/234 are formed in the first set of trenches 281, in the second set of trenches 282, along the first set of lateral recesses 291, and along the second set of lateral recesses 292. See, for example, FIG. 6F.

While the block diagram 1200 of FIG. 8 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Accordingly, in some embodiments, the present disclose relates to a semiconductor device comprising a semiconductor substrate, a plurality of dielectric layers overlying the semiconductor substrate and defining a trench, and a trench capacitor overlying the semiconductor substrate and filling the trench. The trench comprises a plurality of lateral recesses. The trench capacitor further comprises a first capacitor structure and a second capacitor structure that is laterally adjacent to the first capacitor structure. The first capacitor structure comprises a first lateral protrusion that extends toward and fills a first lateral recess of the plurality of lateral recesses, a second lateral protrusion that extends toward the second capacitor structure, and a third lateral protrusion that extends toward the second capacitor structure. The second capacitor structure comprises a fourth lateral protrusion that extends toward the first capacitor structure and that is vertically disposed between the second lateral protrusion and the third lateral protrusion.

In some other embodiments, the present disclose relates to a semiconductor device comprising a semiconductor substrate, a dielectric structure disposed over the semiconductor substrate, and a trench capacitor structure overlying the semiconductor substrate and arranged within the dielectric structure. The trench capacitor structure comprises a first capacitor structure overlying the semiconductor substrate and disposed within the dielectric structure. The first capacitor structure includes a first conductive trunk extending along a first axis, which is perpendicular to an upper surface of the semiconductor substrate, and a plurality of first conductive branches that extend outwardly from the first conductive trunk along a second axis, which is perpendicular to the first axis. The trench capacitor structure further comprises a second capacitor structure overlying the semiconductor substrate and disposed within the dielectric structure laterally adjacent to the first capacitor structure. The second capacitor structure includes a second conductive trunk extending in parallel with the first axis and a plurality of second conductive branches that extend outwardly from the second conductive trunk in parallel with the second axis. The plurality of first conductive branches are interdigitated with the plurality of second conductive branches.

In yet other embodiments, the present disclosure relates to a method for forming a semiconductor device. A dielectric structure is formed comprising a plurality of dielectric layers over a semiconductor substrate. The dielectric structure is patterned with a first etch to form a first set of trenches. The dielectric structure is patterned with a second etch to form a first set of lateral recesses in the first set of trenches that extend outward from the first set of trenches. A first set of capacitor structures is formed in the first set of trenches and along the first set of lateral recesses. The first set of capacitor structures comprises a first set of lateral protrusions that extend outward from the first set of capacitor structures and fill the first set of lateral recesses. The dielectric structure is patterned with a third etch to form a second set of trenches. The dielectric structure is patterned with a fourth etch to form a second set of lateral recesses in the second set of trenches that extend outward from the second set of trenches. A second set of capacitor structures is formed in the second set of trenches and along the second set of lateral recesses. The second set of capacitor structures comprises a second set of lateral protrusions that extend outward from the second set of capacitor structures and fill the second set of lateral recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a plurality of dielectric layers overlying the semiconductor substrate and defining a trench, wherein the trench comprises a plurality of lateral recesses; and
   a trench capacitor overlying the semiconductor substrate and filling the trench, wherein the trench capacitor comprises a first capacitor structure and a second capacitor structure that is laterally adjacent to the first capacitor structure, wherein the first capacitor structure comprises a first lateral protrusion that extends toward and fills a first lateral recess of the plurality of lateral recesses, a second lateral protrusion that extends toward the second capacitor structure, and a third lateral protrusion that extends toward the second capacitor structure, and wherein the second capacitor structure comprises a fourth lateral protrusion that extends toward the first capacitor structure and that is vertically disposed between the second lateral protrusion and the third lateral protrusion,
   wherein the second lateral protrusion is in direct contact with the second capacitor structure.

2. The semiconductor device of claim 1, wherein at least a portion of the second lateral protrusion is directly over at least a portion of the fourth lateral protrusion and at least a portion of the third lateral protrusion is directly under the portion of the fourth lateral protrusion, and wherein the first lateral protrusion and the second lateral protrusion are laterally spaced apart along a common horizontal axis.

3. The semiconductor device of claim 1, wherein a lowermost surface of the second lateral protrusion contacts an uppermost surface of the fourth lateral protrusion, and wherein an uppermost surface of the third lateral protrusion contacts a lowermost surface of the fourth lateral protrusion.

4. The semiconductor device of claim 1, wherein a sidewall of the second lateral protrusion contacts a first sidewall of the second capacitor structure, wherein a sidewall of the third lateral protrusion contacts a second sidewall of the second capacitor structure, and wherein a sidewall of the fourth lateral protrusion contacts a sidewall of the first capacitor structure.

5. The semiconductor device of claim 1, wherein the trench capacitor further comprises a third capacitor structure that is laterally adjacent to the second capacitor structure such that the third capacitor structure is laterally separated from the first capacitor structure by the second capacitor structure, and wherein the second capacitor structure further comprises a fifth lateral protrusion that extends toward the third capacitor structure.

6. The semiconductor device of claim 5, wherein the third capacitor structure comprises a sixth lateral protrusion that extends toward the second capacitor structure and a seventh lateral protrusion that extends toward the second capacitor structure, and wherein the fifth lateral protrusion is vertically disposed between the sixth lateral protrusion and the seventh lateral protrusion.

7. The semiconductor device of claim 6, wherein the first, second, and sixth lateral protrusions are laterally spaced apart along a first horizontal axis, the fourth and fifth lateral protrusions are laterally spaced apart along a second horizontal axis, and the third and seventh lateral protrusions are laterally spaced apart along a third horizontal axis, and wherein the second horizontal axis is vertically between the first horizontal axis and the third horizontal axis.

8. A semiconductor device, comprising:
   a semiconductor substrate;
   a dielectric structure disposed over the semiconductor substrate; and
   a trench capacitor structure overlying the semiconductor substrate and arranged within the dielectric structure, the trench capacitor structure comprising:
     a first capacitor structure overlying the semiconductor substrate and disposed within the dielectric structure, the first capacitor structure including a first conductive trunk extending along a first axis, which is perpendicular to an upper surface of the semiconductor substrate, and a plurality of first conductive branches that extend outwardly from the first conductive trunk and extend perpendicular to the first axis; and
     a second capacitor structure overlying the semiconductor substrate and disposed within the dielectric structure laterally adjacent to the first capacitor structure, the second capacitor structure including a second conductive trunk extending in parallel with the first axis and a plurality of second conductive branches that extend outwardly from the second conductive trunk and extend perpendicular to the first axis, wherein the plurality of first conductive branches are interdigitated with the plurality of second conductive branches,
     wherein sidewalls of the plurality of first conductive branches contact sidewalls of the second conductive trunk.

9. The semiconductor device of claim 8, wherein the dielectric structure comprises:
   a first dielectric layer disposed over the semiconductor substrate, the first dielectric layer comprising a first dielectric material; and a second dielectric layer disposed over the first dielectric layer, the second dielectric layer comprising a second dielectric material that differs from the first dielectric material.

10. The semiconductor device of claim 9:
wherein the first conductive trunk extends through the first dielectric layer and the second dielectric layer along the first axis, and a lowest branch of the first capacitor structure is disposed in the first dielectric layer; and
wherein the second conductive trunk extends through the first dielectric layer and the second dielectric layer in parallel with the first conductive trunk, and a lowest branch of the second capacitor structure is disposed in second dielectric layer.

11. The semiconductor device of claim 8, wherein sidewalls of the plurality of second conductive branches contact sidewalls of the first conductive trunk.

12. The semiconductor device of claim 8, wherein lower surfaces of the plurality of first conductive branches contact upper surfaces of the plurality of second conductive branches, and wherein upper surfaces of the plurality of first conductive branches contact lower surfaces of the plurality of second conductive branches.

13. The semiconductor device of claim 8, wherein the trench capacitor structure further comprises:
a third capacitor structure overlying the semiconductor substrate and disposed within the dielectric structure laterally adjacent to the second capacitor structure, the third capacitor structure including a third conductive trunk extending in parallel with the first axis and a plurality of third conductive branches that extend outwardly from the third conductive trunk and extend perpendicular to the first axis, wherein the plurality of second conductive branches are interdigitated with the plurality of third conductive branches.

14. The semiconductor device of claim 1, wherein the plurality of dielectric layers comprise a first dielectric layer, a second dielectric layer, and a third dielectric layer, wherein the first dielectric layer and the third dielectric layer comprise a first dielectric and the second dielectric layer comprises a second dielectric, different from the first dielectric, and wherein the first lateral recess is delimited by an upper surface of the second dielectric layer and a sidewall of the first dielectric layer that is offset from a sidewall of the second dielectric layer.

15. The semiconductor device of claim 8, wherein a first cavity extends along the first conductive trunk and the plurality of first conductive branches, and wherein a second cavity extends along the second conductive trunk and the plurality of second conductive branches.

16. A semiconductor device, comprising:
a plurality of dielectric layers over a substrate;
a trench in the plurality of dielectric layers;
a first capacitor structure in the trench;
a second capacitor structure in the trench and neighboring the first capacitor structure; and
a third capacitor structure in the trench and neighboring the second capacitor structure, wherein the second capacitor structure is arranged laterally between the first capacitor structure and the third capacitor structure,
wherein the first capacitor structure comprises a first lateral protrusion that is disposed at a first height and that laterally protrudes toward the second capacitor structure, wherein the third capacitor structure comprises a second lateral protrusion that is disposed at the first height and that protrudes laterally toward the second capacitor structure, wherein the second capacitor structure comprises a third lateral protrusion that is disposed at a second height and that protrudes laterally toward the first capacitor structure, and wherein the second capacitor structure comprises a fourth lateral protrusion that is disposed at the second height and that laterally protrudes toward the third capacitor structure,
wherein the plurality of dielectric layers comprise a first dielectric layer disposed at the first height and a second dielectric layer disposed at the second height, wherein the first dielectric layer comprises a first dielectric and the second dielectric layer comprises a second dielectric, different from the first dielectric.

17. The semiconductor device of claim 16, wherein the trench is delimited, at least in part by a sidewall of the first dielectric layer and a sidewall of the second dielectric layer, wherein the sidewall of the first dielectric layer is laterally offset from the sidewall of the second dielectric layer, and wherein the trench comprises a lateral recess that is delimited, at least in part, by the sidewall of the first dielectric layer and a lower surface of the second dielectric layer.

18. The semiconductor device of claim 17, wherein the first capacitor structure further comprises a fifth lateral protrusion that is disposed at the first height and that laterally extends away from the first lateral protrusion and into the lateral recess.

19. The semiconductor device of claim 17,
wherein the first capacitor structure comprises a first outer electrode layer, a first insulator layer within the first outer electrode layer, and a first inner electrode layer within the first insulator layer that extend along the first lateral protrusion,
wherein the second capacitor structure comprises a second outer electrode layer, a second insulator layer within the second outer electrode layer, and a second inner electrode layer within the second insulator layer that extend along the third lateral protrusion and the fourth lateral protrusion,
wherein the third capacitor structure comprises a third outer electrode layer, a third insulator layer within the third outer electrode layer, and a third inner electrode layer within the third insulator layer that extend along the second lateral protrusion, and
wherein the first outer electrode layer contacts the second outer electrode layer at the first lateral protrusion and the third lateral protrusion, and wherein the third outer electrode layer contacts the second outer electrode layer at the second lateral protrusion and the fourth lateral protrusion.

20. The semiconductor device of claim 15, wherein the first cavity is delimited, at least in part, by sidewalls of the first conductive trunk.

* * * * *